United States Patent [19]
Mitchell

[11] Patent Number: 5,323,335
[45] Date of Patent: Jun. 21, 1994

[54] REGULAR AND FAULT-TOLERANT KALMAN FILTER SYSTOLIC ARRAYS

[75] Inventor: William F. Mitchell, Jobstown, N.J.

[73] Assignee: General Electric Co., Moorestown, N.J.

[21] Appl. No.: 726,419

[22] Filed: Jul. 5, 1991

[51] Int. Cl.$^5$ .............................................. G06F 7/38
[52] U.S. Cl. ................................ 364/572; 364/724.17
[58] Field of Search ............... 364/572, 724.01, 724.05, 364/724.07

[56] References Cited

U.S. PATENT DOCUMENTS 4,823,299  4/1989  Chang et al. ................ 364/714.01 X

OTHER PUBLICATIONS

"Two-Dimensional Systolic Array for Kalman-Filter Computing" for Oct. 1988, NASA Tech Brief vol. 12, No. 9, Item #116 from JPL Invention Rpt. NPO-17108/6624, NASA, Contract No. NAS 7-100. Inventors: J. J. Chang, H. Yeh, invention report prepared by R. S. Jamieson, Jet Propulsion Laboratory, Pasadena, Calif.

Primary Examiner—Jack B. Harvey
Assistant Examiner—Edward Pipala
Attorney, Agent, or Firm—William H. Meise; Stephen A. Young; Geoffrey H. Krauss

[57] ABSTRACT

A Kalman filter, for a dynamic system having a number N of different states and another number M of observational components, uses a fixed rectangular systolic array of $N \times (N+1)$ parallel data processing elements for a regular filter, and uses an array of $(N+2) \times (N+3)$ processing elements for a fault-tolerant filter; the processing elements in either configuration are connected in a four-nearest-neighbors network. Each processor is capable of carrying out a commanded one of a plurality of different vector-data operations sets during each of eight passes through the array. The systolic array operates on the matrices in a pipeline manner, so that each pass through the processor array feeds the result back into the array to begin the next computation.

13 Claims, 19 Drawing Sheets

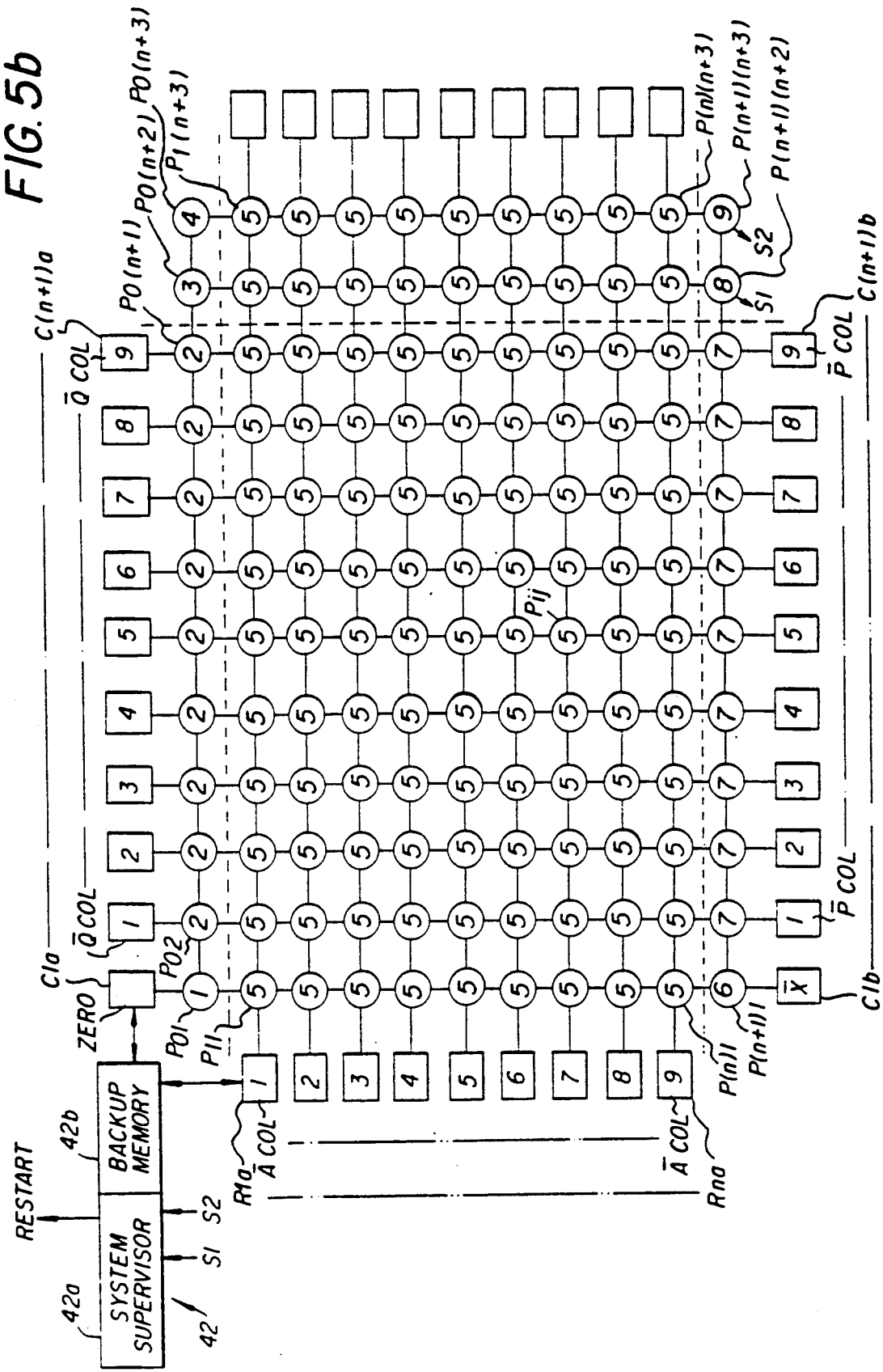

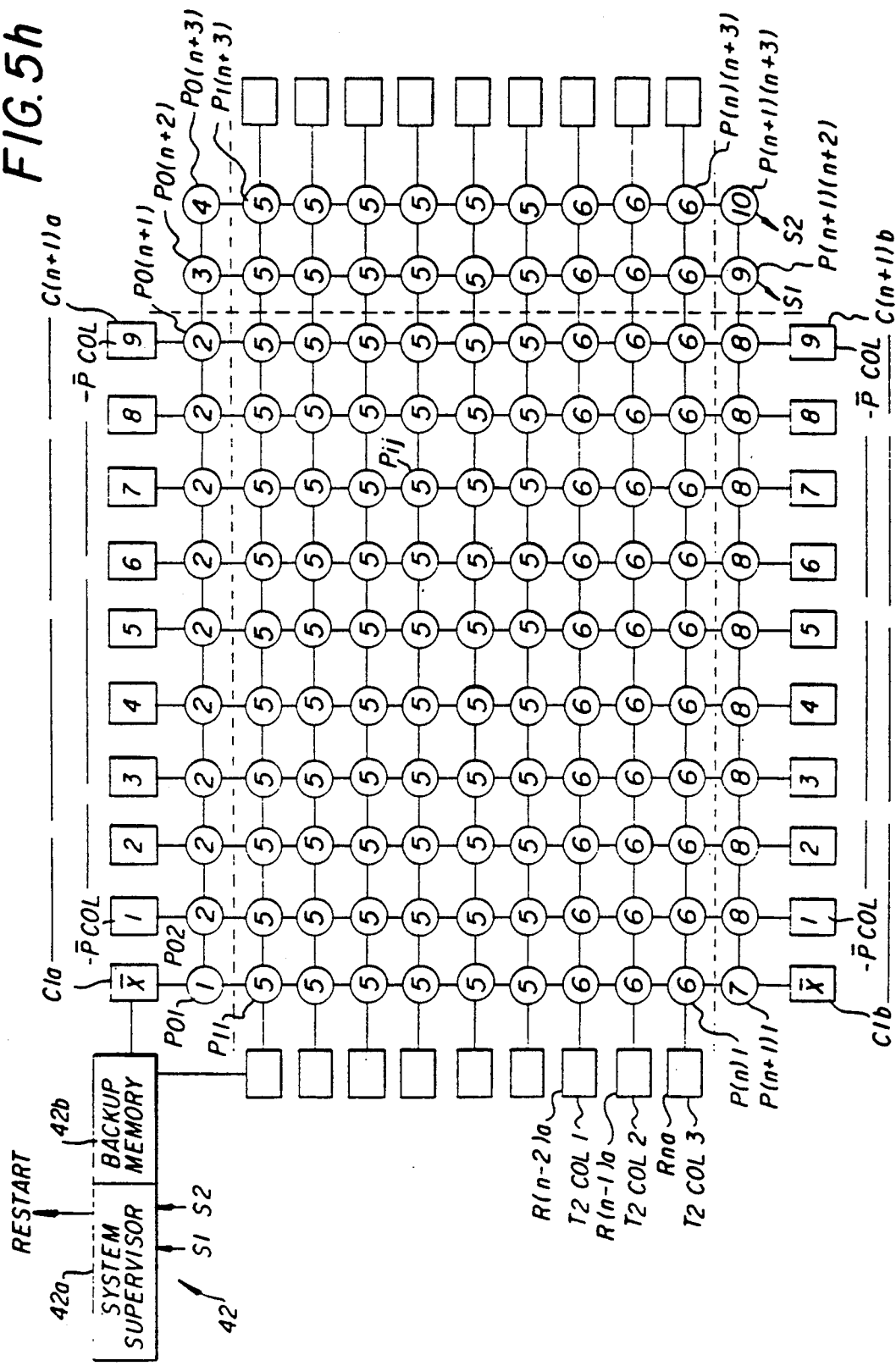

REGULAR AND FAULT-TOLERANT KALMAN FILTER SYSTOLIC ARRAYS

BACKGROUND OF THE INVENTION

The present invention relates to real-time Kalman filters and, more particularly, to novel systolic array Kalman filters which perform parallel data processing in real time, using eight-pass processing in a two-dimensional (2D) array of processing elements of $N \times (N+1)$ size, where N is the number of states of the dynamic system being estimated by the Kalman filter; a fault-tolerant Kalman filter has a systolic array with an additional two columns and rows, i.e. a $(N+2) \times (N+3)$ array.

The Kalman filter is well known to be an optimal recursive least-squares estimator for linear dynamical systems with white noise. A Kalman filter updates the state estimation based on prior state estimates and inputs of observed (measured) system variables. The system variables are measured in real-time (i.e. as they occur) so that system variable data can be directly input to the Kalman filter and need not be stored. The conventional filter requires input of all the associated matrices; the system dynamics, the measurement dynamics and the system noise behavior must all be known for a discrete time-varying Kalman filter to properly calculate the propagation of state estimates and error-covariance matrices between successive time samples. Many digital signal processing applications require the real time computation of the Kalman filter, e.g., tracking an aircraft with radar. Consequently, many papers have been published on the use of parallel processing technology in the form of systolic arrays for fast computation of the Kalman filter. Unfortunately, the Kalman filter cannot be pipelined since the result of the last equation is needed as input for the first equation. This results in an excess of hardware with many processors idle at any given time. In another approach (see e.g. Jet Propulsion Laboratory's Innovation Report NPO-17108/6624), the equations are reformulated such that eight applications of the Faddeev algorithm produce the desired result. Thus the systolic array is programmed for the Faddeev algorithm and the data flows through the array eight times during each iteration of the Kalman filter. However, the Faddeev algorithm requires doubling the dimension of the matrices (i.e. requiring the use of a $2N \times 2N$ systolic array of parallel processors), and consequently the systolic array takes more processing elements and time steps than necessary. It is desirable to provide a new systolic array implementation of the Kalman filter that is not excessive in either hardware (e.g. having about $N \times (N+1)$ processors in a fixed-size systolic array) or computation steps (i.e. having about $4N+6M$ computational steps, where M is the number of observational components).

BRIEF SUMMARY OF THE INVENTION

In accordance with my invention, a Kalman filter for a dynamic system having a first plurality N of different states and a second plurality M of observational components, uses a fixed rectangular systolic array of $N \times (N+1)$ parallel data processing means for a regular filter, and uses an array of $(N+2) \times (N+3)$ processing means for a fault-tolerant filter; the processing means in either configuration are connected in a four-nearest-neighbors network. Each processor is capable of carrying out a commanded one of a plurality of different vector-data operation sets during each of eight passes through the array. Each pass implements one equation of a new form into which the Kalman filter equations are rewritten. Seven of these equations are of the form (matrix=matrix*matrix+matrix) and the eighth equation is a QR decomposition of a matrix. Both of these equation operational forms are executed efficiently in the systolic array; one pass through the systolic array is required for each of the eight equations. The resultant matrix of one equation is one of the matrices in the product of the next equation. The systolic array is caused to operate on the equations in a pipeline manner, so that each pass through the processor array feeds the result of one equation back into the array to begin computation of the next equation. During much of the processing time, three equations are simultaneously being computed in different parts of the array. For a dynamical system with N states and M observation components, the array uses about $4N+6M$ computation steps.

A fault-tolerant form of my novel Kalman filter uses a slightly larger systolic array of $(N+2) \times (N+3)$ stages, which has an additional two rows and an additional two columns in its systolic array, but is still of a size less than the previous $2N \times 2N$ array for $N > 3$. In this Kalman filter, the first and last rows and the last two columns of processing elements are added for fault-tolerant functions; a system supervisor checks the ratio of the data in processors of the last two columns of the extended array to determine if a fault has occurred and to ascertain in which column of the array the fault was located.

Accordingly, it is an object of the present invention to provide a novel Kalman filter having a fixed systolic array of pipelined parallel processing stages, of respective size $N \times (N+1)$ or $(N+2) \times (N+3)$ for respective normal or fault-tolerant operation, for eight-pass production of desired output data.

This and other objects of the present invention will become apparent to those skilled in the art upon a reading of the following detailed description of one presently preferred embodiment of each of the normal and fault-tolerant versions of my novel Kalman filter, when considered in conjunction with the associated drawings.

BRIEF DESCRIPTION OF THE DRAWINGS

FIGS. 5a–5h are a set of array schematic block diagrams illustrating vector/matrix input/outputs and array processor configurations for each of the eight processing passes in a fault-tolerant form of the systolic assay Kalman filter of the present invention.

DETAILED DESCRIPTION OF PREFERRED INVENTION EMBODIMENTS

Figure 1:
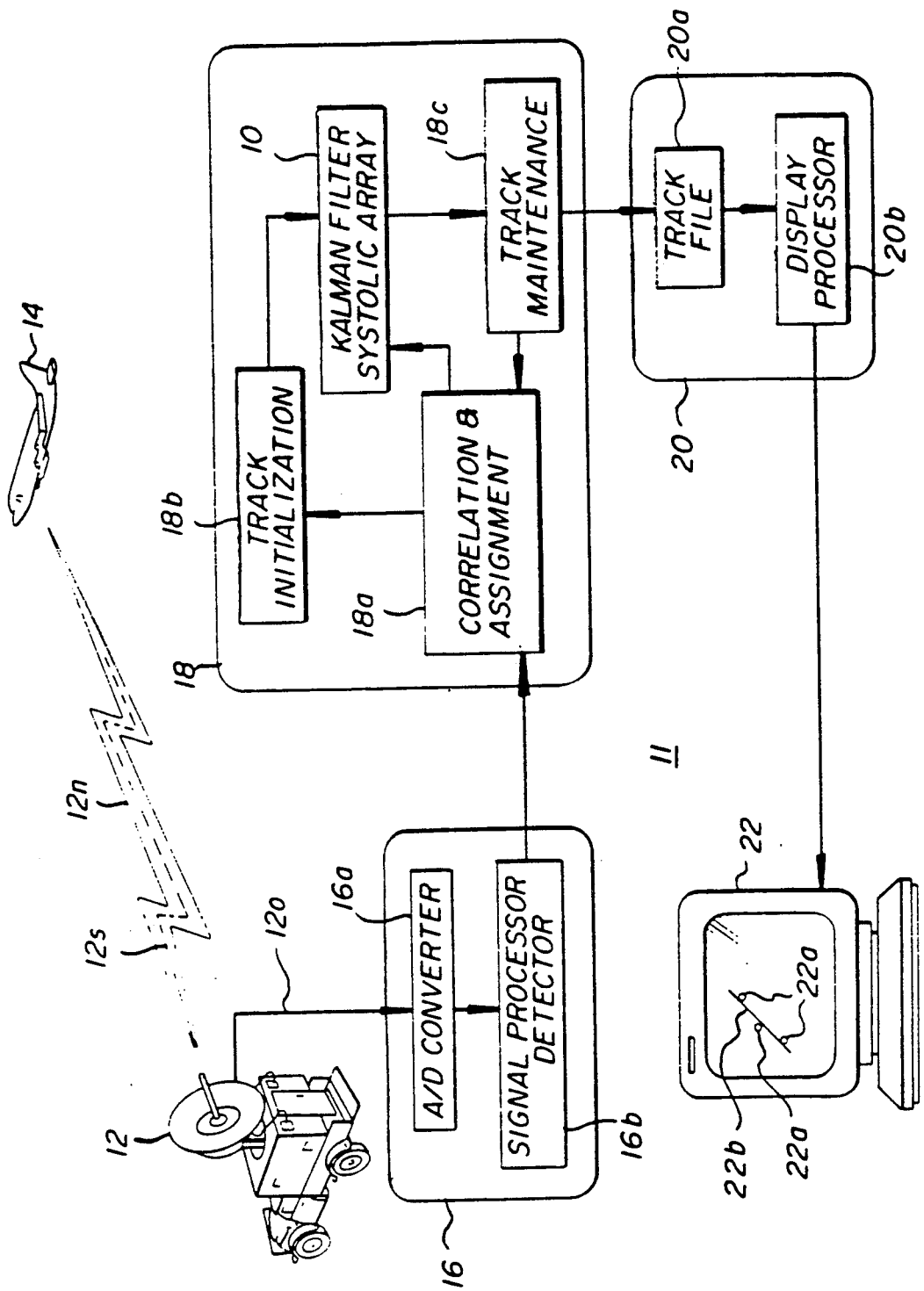
FIG. 1 is a block diagram of one example of an electronic system in which the Kalman filter of the present invention can be used.

Referring initially to FIG. 1, a systolic array Kalman filter 10 of the present invention can be used in a wide variety of electronic systems 11. By way of illustration only, system 11 is an aircraft-observation radar system, such as might be used at an airport and the like. A tracking radar front end 12 (including the system transmitter, antenna, receiver and the like) can be permanently or, as shown, portably mounted at some location. A target 14 (e.g. an aircraft to be tracked) reflects some of the transmitted energy; the reflected signal 12s may be quite small and not substantially greater than a masking noise signal 12n (i.e. the return signal, and the front-end output analog signal 12o, has a low signal-to-noise ratio). The output analog signal enters a data converter means 16, including an analog-to-digital converter means 16a for converting the analog signal 12o to a multi-bit parallel digital data signal (such a digital signal will be shown herein by a diagonal-slashed signal line); a post-conversion signal processor detector means 16b operates on the digital data, before coupling to a tracking processor means 18. Means 18 may include a correlation and assignment means 18a and a track initialization means 18b, for providing the necessary aircraft track digital data state and linear system signals to the Kalman filter systolic array 10, and may also include a track maintenance means 18c using the Kalman filter output data. One output of means 18c is routed out of means 18 and into a track display data processor means 20, which may use a track file storage means for maintaining tracking files for each individual designated aircraft 14 and a display processor means for properly converting the track file data into signals capable of being displayed to a viewer via a visual display means 22. Thus, noisy raw data points 22a may be filtered and displayed as a least-squares best-fit real-time estimation 22b of the location of the aircraft 14.

Use of my Kalman filter implementation assumes that the dynamical linear system (e.g. the radar) has a state model of the form $$\bar{x}(k+1) = \bar{A}\bar{x}(k) + \bar{w}(k) \tag{1a}$$

$$\bar{y}(k) = \bar{D}\bar{x}(k) + \bar{v}(k) \tag{1b}$$

where
$\bar{x}(k)$ is an $N \times 1$ state input vector at time k,
$\bar{y}(k)$ is an $M \times 1$ measurement input vector,
$\bar{A}$ is an $N \times N$ state transition matrix,
$\bar{D}$ is an $M \times N$ measurement transition matrix,
$\bar{w}(k)$ is an $N \times 1$ process noise vector,
$\bar{v}(k)$ is an $M \times 1$ measurement noise vector,
N is the number of states, and
M is the number of measurements.
It is assumed that $\bar{w}(k)$ and $\bar{v}(k)$ are zero mean white Gaussian random variables.

For illustrative purposes, again consider the case of three-dimensional aircraft tracking with radar, although this Kalman filter systolic array applies to any other linear state model as well. With three-dimensional radar tracking, a state model with 3 measurements (range, azimuth, and altitude) and 9 states (position, velocity, and acceleration in each of range, azimuth, and altitude) is assumed. The state $\bar{A}$ and measurement transition $\bar{D}$ matrices are given by $$\bar{A} = \begin{bmatrix} 1 & d & d \cdot d/2 & 0 & 0 & 0 & 0 & 0 & 0 \\ 0 & 1 & d & 0 & 0 & 0 & 0 & 0 & 0 \\ 0 & 0 & 1 & 0 & 0 & 0 & 0 & 0 & 0 \\ 0 & 0 & 0 & 1 & d & d \cdot d/2 & 0 & 0 & 0 \\ 0 & 0 & 0 & 0 & 1 & d & 0 & 0 & 0 \\ 0 & 0 & 0 & 0 & 0 & 1 & 0 & 0 & 0 \\ 0 & 0 & 0 & 0 & 0 & 0 & 1 & d & d \cdot d/2 \\ 0 & 0 & 0 & 0 & 0 & 0 & 0 & 1 & d \\ 0 & 0 & 0 & 0 & 0 & 0 & 0 & 0 & 1 \end{bmatrix}$$

and $$\bar{D} = \begin{bmatrix} 1 & 0 & 0 & 0 & 0 & 0 & 0 & 0 & 0 \\ 0 & 0 & 0 & 1 & 0 & 0 & 0 & 0 & 0 \\ 0 & 0 & 0 & 0 & 0 & 0 & 1 & 0 & 0 \end{bmatrix}$$

where d is the time lapse, or delay, between measurements.

My systolic array Kalman filter is defined by the equations:

$$\hat{x}(k|k-1) = \bar{A}\hat{x}(k-1|k-1) \tag{2a}$$

$$\hat{P}(k|k-1) = \bar{A}\hat{P}(k-1|k-1)\bar{A}^T + \bar{Q}(k-1) \tag{2b}$$

$$\bar{K} = \hat{P}(k|k-1)\bar{D}^T[\bar{D}\hat{P}(k|k-1)\bar{D}^T + \bar{E}(k)]^{-1} \tag{2c}$$

$$\hat{x}(k|k) = \hat{x}(k|k-1) + \bar{K}[\bar{y}(k) - \bar{D}\hat{x}(k|k-1)] \tag{2d}$$

$$\hat{P}(k|k) = \hat{P}(k|k-1) - \bar{K}\bar{D}\hat{P}(k|k-1) \tag{2e}$$

where
$\hat{x}(k|k-1)$ is the time k state estimate given measurements through time (k−1)
$\hat{x}(k|k)$ is the time k state estimate given measurements through time k
$\hat{P}(k|k-1)$ is the estimate of the state covariance at time k given measurements through time (k−1)
$\hat{P}(k|k)$ is the estimate of the state covariance at time k given measurements through time k
$\bar{Q}(k) = E[ww^T]$ is the process noise covariance matrix
$\bar{F}(k) = E[vv^T]$ is the measurement noise covariance matrix
$\bar{K}$ is the Kalman gain matrix
where $E[]$ is the expectation operator.

Equations (2a)–(2e) can be rewritten in the form $$\bar{T}_1 = \bar{P}\bar{A}^T \tag{3a}$$

$$[\bar{x}|\bar{P}] = \bar{A}[\bar{x}|\bar{T}_1] + [\bar{0}|\bar{Q}] \tag{3b}$$

$$\bar{T}_2 = \bar{P}\bar{D}^T \tag{3c}$$

$$[\bar{t}_1|\bar{T}_3] = \bar{D}[-\bar{x}|\bar{T}_2] + [\bar{y}|\bar{F}] \tag{3d}$$

$$\overline{OU} = \bar{T}_3 \tag{3e}$$

$$[\bar{t}_2|\bar{T}_4] = \bar{O}^T[\bar{t}_1|\bar{T}^T_2] \tag{3f}$$

$$[\bar{t}_3|\bar{T}_5] = \bar{U}^{-1}[\bar{t}_2|\bar{T}_4] \tag{3g}$$

$$[\bar{x}|\bar{P}] = \bar{T}_2[\bar{t}_3|-\bar{T}_5] + [\bar{x}|\bar{P}] \tag{3h}$$

where the k factors have been dropped for notational convenience. Here I use the notational form $[G|H]$ to denote a matrix in which the first columns are those of matrix G and the last columns are those of matrix H.

Figure 2:
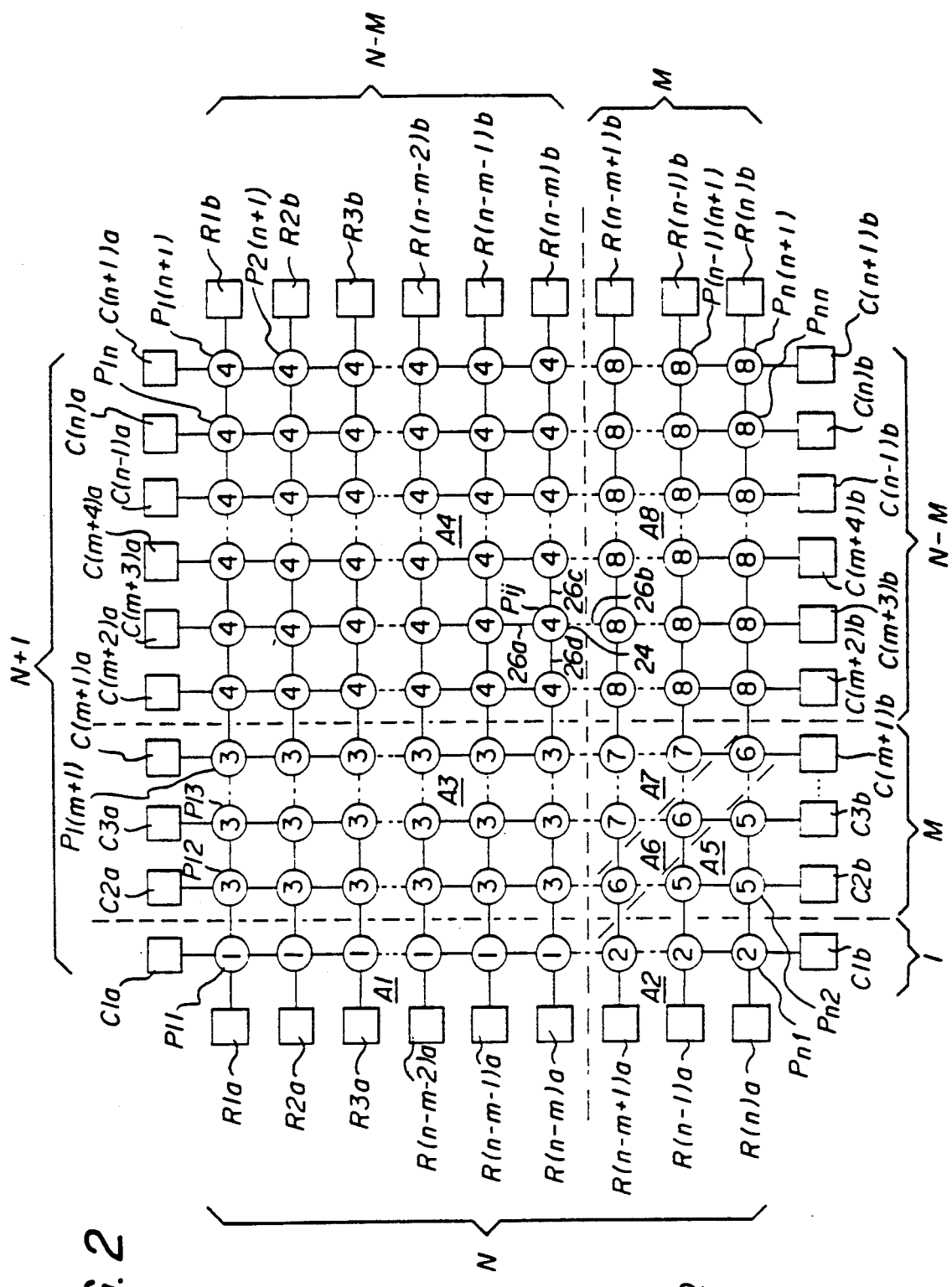
FIG. 2 is a schematic block diagram of a regular (non-fault-tolerant) form of the systolic array Kalman filter of the present invention.

Referring now to FIG. 2, the regular (non-fault-tolerant) Kalman filter systolic array 10 is an $N \times (N+1)$ rectangular array of processing elements 24. Each processor element (PE) is a vector-manipulating digital data processor means Pij, where $1 \leq i \leq n$ and $1 \leq j \leq (n+1)$, with internal storage register means and external connections via a 2-word data channel 26 to each of the four nearest neighbors; thus, a first data channel 26a connects a PE Pij to its upper neighbor P(i−1)j, if present, and a second data channel 26b connects that same Pij PE to its lower neighbor P(i+1)j, if present, while respective data channels 26c and 26d respectively connect the same Pij PE to its rightward and leftward neighbors, Pi(j−1) and Pi(j+1) respectively, if those neighboring PEs are present. The boundary PEs are connected to data memories shared with other PEs. Each PE has its own program and a few data storage registers. Synchronization among the PEs is accomplished by the passing of data with waits until the data is available from a neighbor or until a neighbor has accepted the previously sent data. For example, those skilled in the processor programming and Kalman filtering arts may program each PE to seek new input data for each of the vector/matrix data items necessary for the next stage of computation, temporarily store each new data item as it becomes available, and only undertake the stage activity when all necessary items are available to the stage.

The PE programs are based on eight different types of fundamental systolic steps, each based on an underlying algorithm; each type is individually described hereinbelow. In these types: M and N are generic variables and are not necessarily the same as the number of the pluralities of measurements M and states N; and loops for which the upper limit is less than the lower limit ("zero pass loops") are not executed. Further, each processing means has available (i.e. "knows", via stored data and the like) its own location (PE_row, PE_col) in the 2D array of processing elements.

PE Step Type (1): (Pass Down), (Pass Right)
Action = Pass data downwardly (or rightwardly)
This step is used when a PE is not to perform any operations on the data, merely pass it on so that it will eventually leave the array. The process algorithm is fundamentally programmed as:

```
for loop = 1 to N
    get G̅ from top (or left) port
    send G̅ down (or right)
endfor
``` where here, as in the following 7 types of steps, G̅ is a single element of a generic vector/matrix. The operation for the first-listed action (i.e. pass down) is shown directly, while the operation for the other listed action (i.e. pass right) is shown in parentheses and will replace the directly-shown operation for that other action.

PE Step Type (2): (Load down)
Action = Load data downwardly, from upper registers
This step is used to load a vector of length N into a column of N PEs for later processing. The top PE receives the first datum, second PE receives the second datum, etc. The step has a process algorithm programmed as:

```
get G̅ from top port
register = G̅
for loop = 1 to N-PE_row
    get G̅ from top port
    send G̅ down
endfor
```

PE Step Type (3): (Empty right, Empty down)
Action = Empty array data rightwardly (or downwardly)
This step is used to remove data resident in the systolic array. The data in the left column (top row) of processors is the first to leave the array. The process algorithm for step 3 is set up as:

```
for loop = 1 to PE_col-1 (PE_row-1)
    get G̅ from left port (top port)
    send G̅ right (down)
endfor
send register right (down)
```

PE Step Type (4): (SRMM)
Action = Stationary result matrix multiplication
This step computes the product of an N×L array G̅ with an L×M array H̅ in an N×M systolic array. The rows of G̅ are passed in the left side of the systolic array and the columns of H̅ are passed in through the top of the systolic array. The product ends up in the array. The algorithm used is:

```
register = 0
for loop = 1 to L
    get G̅ from left port and H̅ from top port
    register = register + G̅*H̅
    send G̅ right and H̅ down
endfor
```

PE Step Type (5): (MRMM)
Action = Moving result matrix multiplication
This step computes the product and sum, i.e. G̅*H̅+J̅ where G̅ is an N×L array, H̅ is an L×M array and J̅ is an N×M array. This algorithm uses an L×M systolic array. H̅ is initially resident in the array registers. The columns of G̅ are passed in the left side of the array and the columns of J̅ are passed in through the top of the array. The result comes out the bottom of the array. The program may be:

```
for loop = 1 to N
    get G̅ from left port and J̅ from top port
    send G̅ right and (G̅*register + J̅) down
end for
```

PE Step Type (6): (QR(int), QR (diag))
Action = QR decomposition
This step decomposes an N×M matrix G̅ into the product of an N×M orthogonal matrix Q̅ and an M×M upper triangular matrix U̅ by using Given's rotations in an M×M lower triangular systolic array. The columns of G̅ enter the array from the left. The rotation parameters for Q̅, i.e. (Ĉ,Ŝ), come out the bottom. Matrix U̅ may be processed from the result in the array, as transpose U̅$^T$ of matrix U̅ actually ends up in the array. Here the processor must select to implement one of two different algorithms at any time, depending on whether the PE is on the diagonal (top) or is interior (all others).

For each of the Diagonal PEs, the process algorithm is:

```
 for loop = 1 to N
    get G̅ from left port
    if loop = 1 then
       if G̅ = 0 then
          Ĉ = 1
          Ŝ = 0
          register = 0
       else
          Ĉ = 0
          Ŝ = sgn(G̅)
          register = abs(G̅)
       endif
    else
       if G̅ = 0 then
          Ĉ = 1
          Ŝ = 0
       else
          r' = sqrt(register*register + G̅*G̅)
          Ĉ = register/r'
          Ŝ = G̅/r'
          register = r'
       endif
    endif
    send (Ĉ,Ŝ) down
 endfor
``` and for each of the Interior Pes, the algorithm may be:
register = 0

```
 for loop = 1 to N
    get G̅ from left port and (Ĉ,Ŝ) from top port
    temp = Ĉ*G̅ − Ŝ*register
    register = Ŝ*G̅ + Ĉ*register
    send temp right and (Ĉ,Ŝ) down
 endfor
```

PE Step Type (7): (QM)
Action=Multiplication by Q transpose via rotation parameters This step multiples an N×L matrix G̅ by the transpose of the N×M orthogonal matrix Q̅ using the rotation parameters (Ĉ,Ŝ) output from a preceding Step (6) operation. Matrix G̅ enters the array from the top; the rotation parameters for matrix Q̅ enter from the left side of the array. The result is left in the M×L systolic array. The program can be:

```
 register = 0
 for loop = 1 to N
    get (Ĉ,Ŝ) from left port and G̅ from top port
    temp = Ĉ*G̅ − Ŝ*register
    register = Ŝ*G̅ + Ĉ*register
    send (Ĉ,Ŝ) right and temp down
 endfor
```

PE Step Type (8): (Uinv)
Action=Multiplication by inverse of upper triangular matrix This final step type acts to multiply M×N matrix G̅ by the inverse of an M×M upper triangular matrix U̅. Matrix G̅ is initially located in the M×N systolic array. The rows of matrix U̅ are passed in through the left side of the array. The result is left in the array. The algorithm program can be:

```
  for loop = 1 to M-PE_row
     get U̅ from left port and G̅ from bottom port
     register = register − U̅*G̅
     pass U̅ right and G̅ up
  endfor
  get U̅ from left port
```

```
  register = register/U̅
  pass U̅ right and register up
```

It will be seen that my novel Kalman filter systolic array thus has processors P11-Pn(n+1) arranged in the aforementioned N×(N+1) rectangular array, with the array having an i-th one of a plurality (N+1) of input-/output registers C1a-C(n+1)a at the top end of each associated i-th one of the N+1 columns of the array and an i-th one of another plurality (N+1) of registers C1b-C(n+1)b at the bottom end of the associated i-th array column. The array also has a j-th one of a plurality N of input/output registers R1a-Rna at the left end of each associated j-th one of the N rows and a different plurality of registers R1b-Rnb at the right end of each like-numbered j-th row. Each processing element Pij has its own program(s) for operation and synchronization, and its own set of registers for temporary storage of input, intermediate result(s) and/or output data. A presently preferred array can be formed of iWARP System processors available from Intel, preferably with interfacing to a SUN workstation for I/O; ultimately, if a dedicated Kalman filter array is to be implemented for a particular application, an Application-Specific Integrated Circuit (ASIC) may be designed for that filter.

There are eight classes (1)-(8) of processors in the array, as illustrated in FIG. 2, with all PEs of the same class running nearly identical programs. Each PE program includes a sequence of eight steps, with each step corresponding to one of the eight equations (3a)-(3h); a NULL step indicates that this PE has no operations in this step and proceeds immediately with the next step. Boundary elements read and write directly to memories shared by other boundary elements in lieu of receiving and passing data on the boundary sides. To minimize memory access conflicts, each memory is connected to 1-4 processors and each matrix is distributed over several memories, e.g., each column of the matrix P̅ is in a different, but associated, one of the memory registers Cja, Cjb, Ria or Rib respectively connected to the respective one of the top, bottom left or right PEs.

Figure 3:
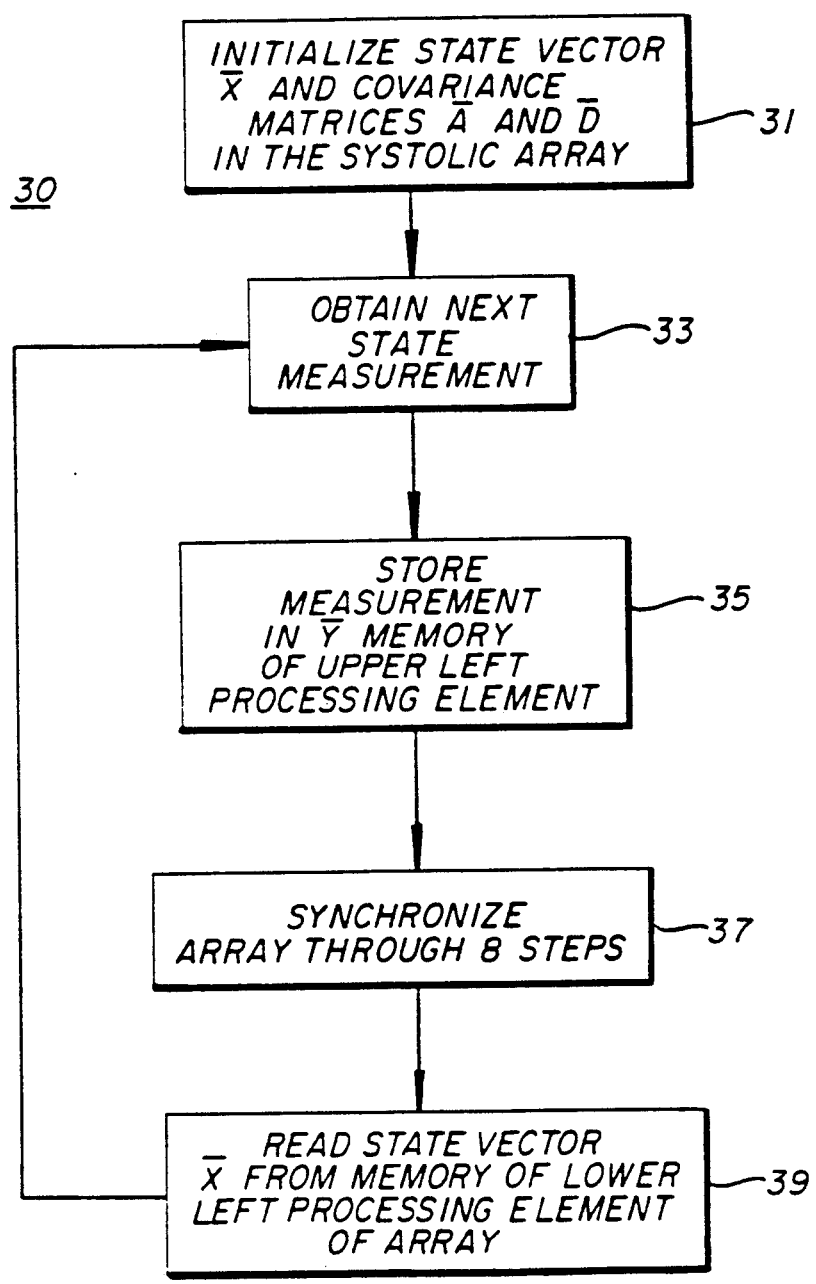
FIG. 3 is a flow diagram illustrating the steps necessary for processing of digital input data vectors $\bar{x}$ through the Kalman filter systolic array of FIG. 2.
Figure 4A:
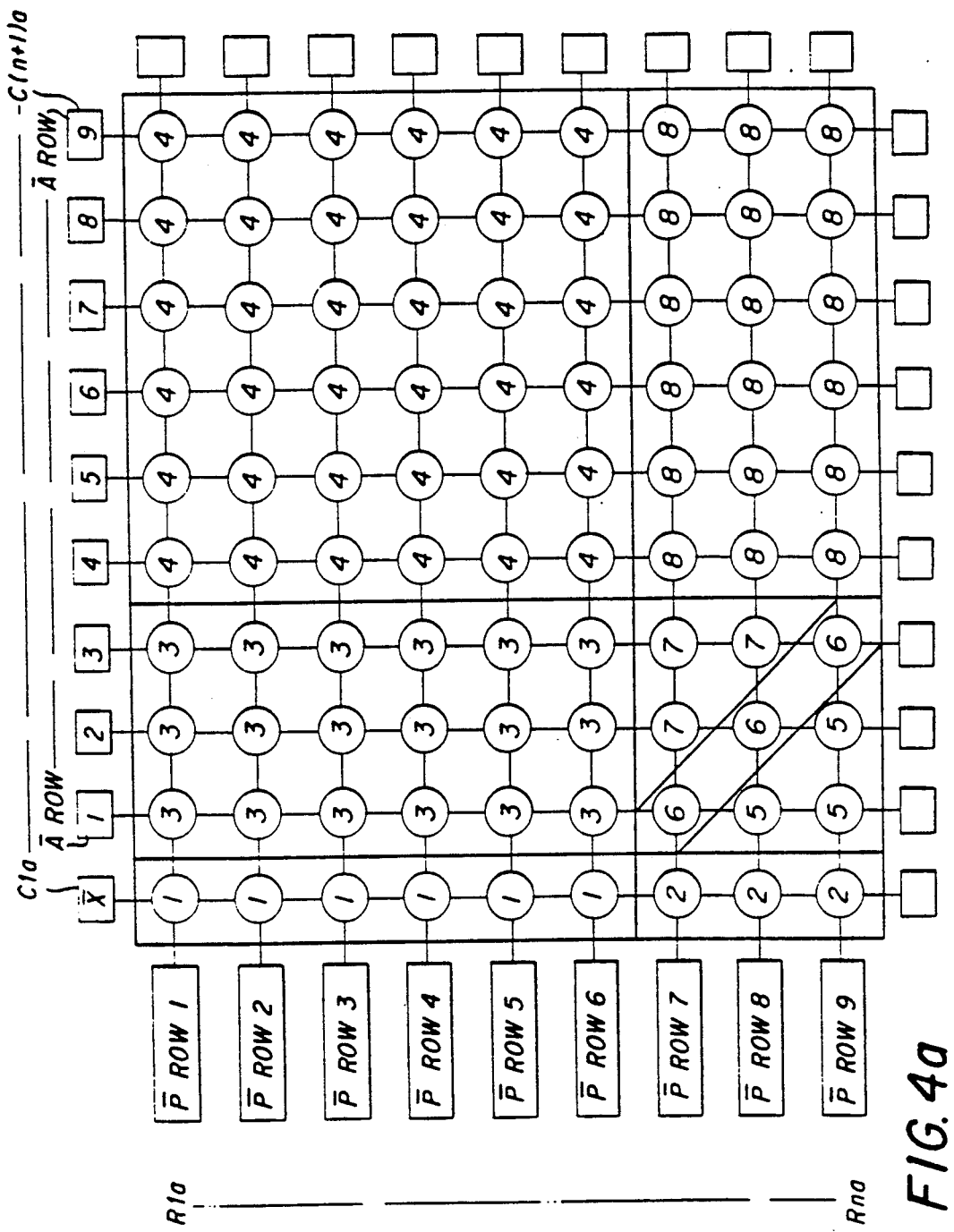
FIGS. 4a–4h are a set of array schematic block diagrams illustrating vector/matrix input/outputs and array processor configurations for each of the eight processing passes in the regular Kalman filter of FIG. 2.
Figure 4B:
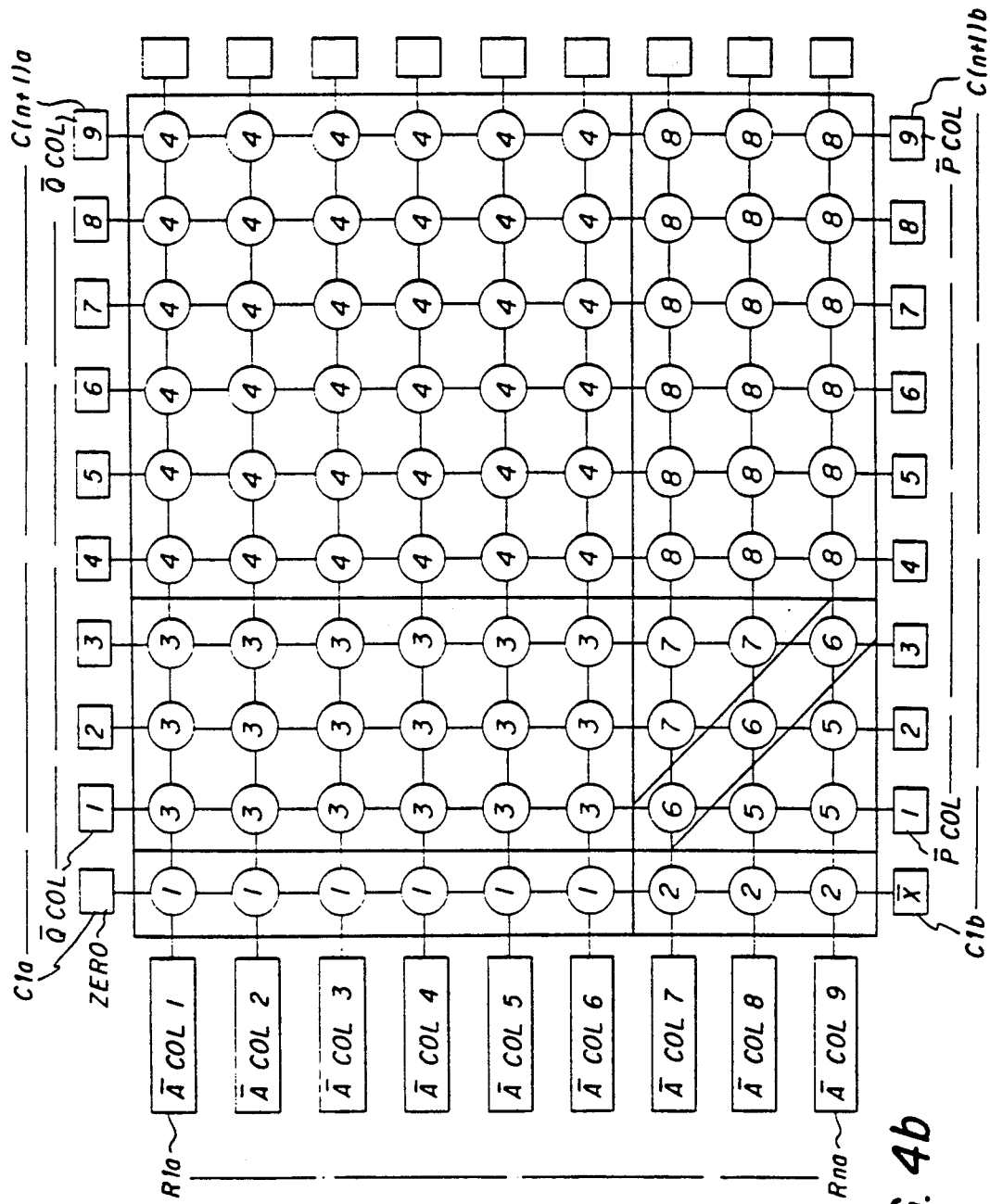
Figure 4C:
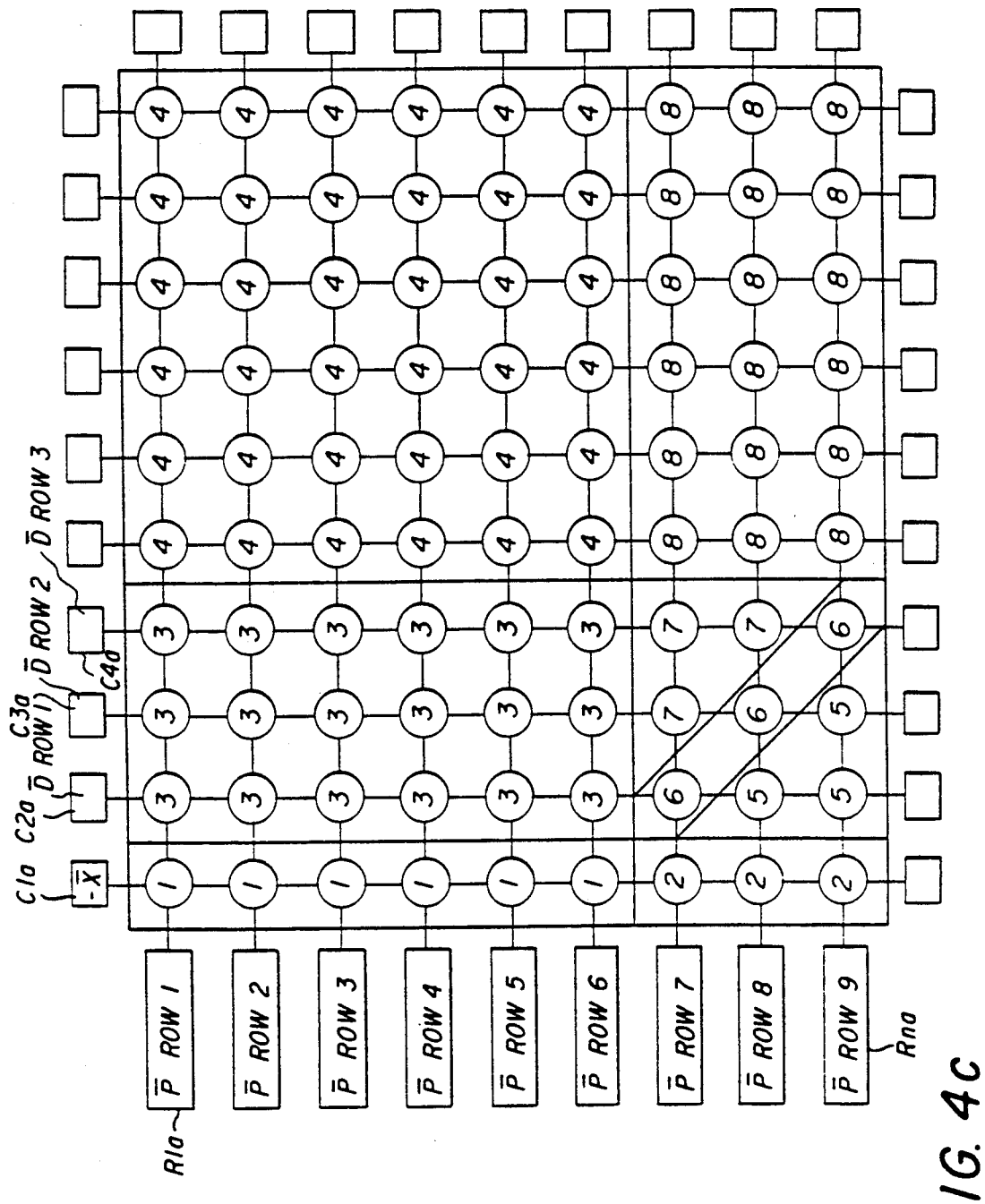
Figure 4D:
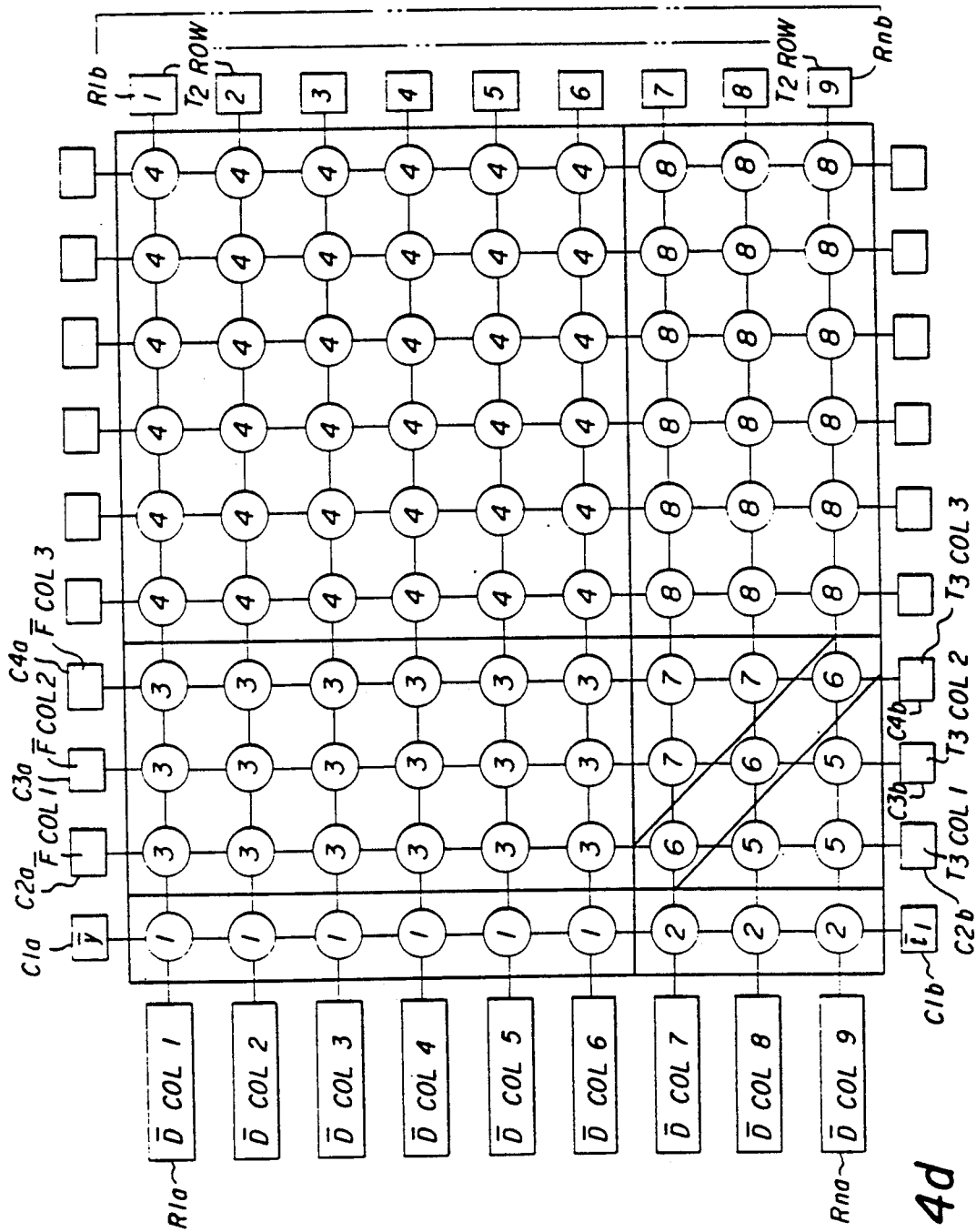
Figure 4E:
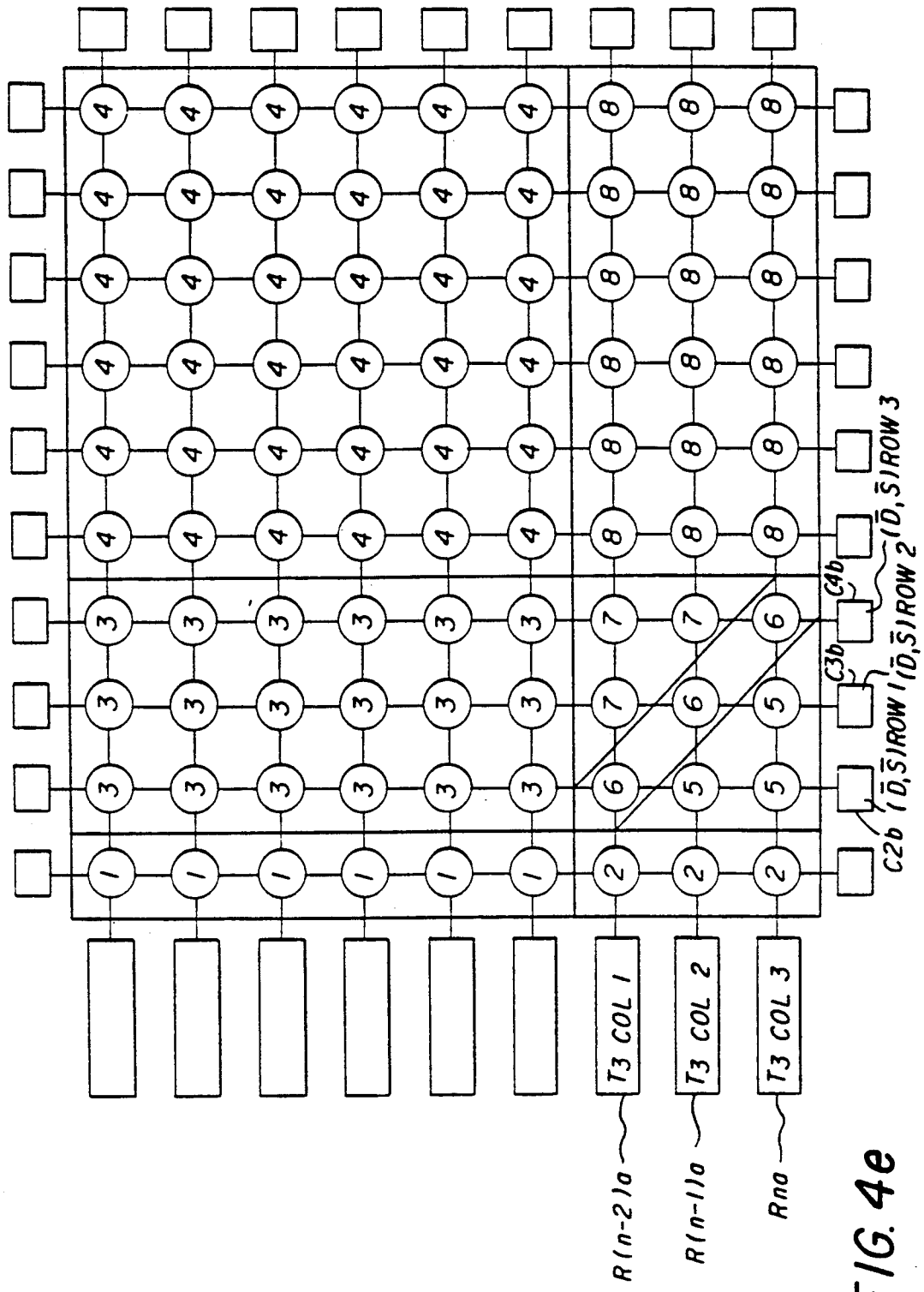
Figure 4F:
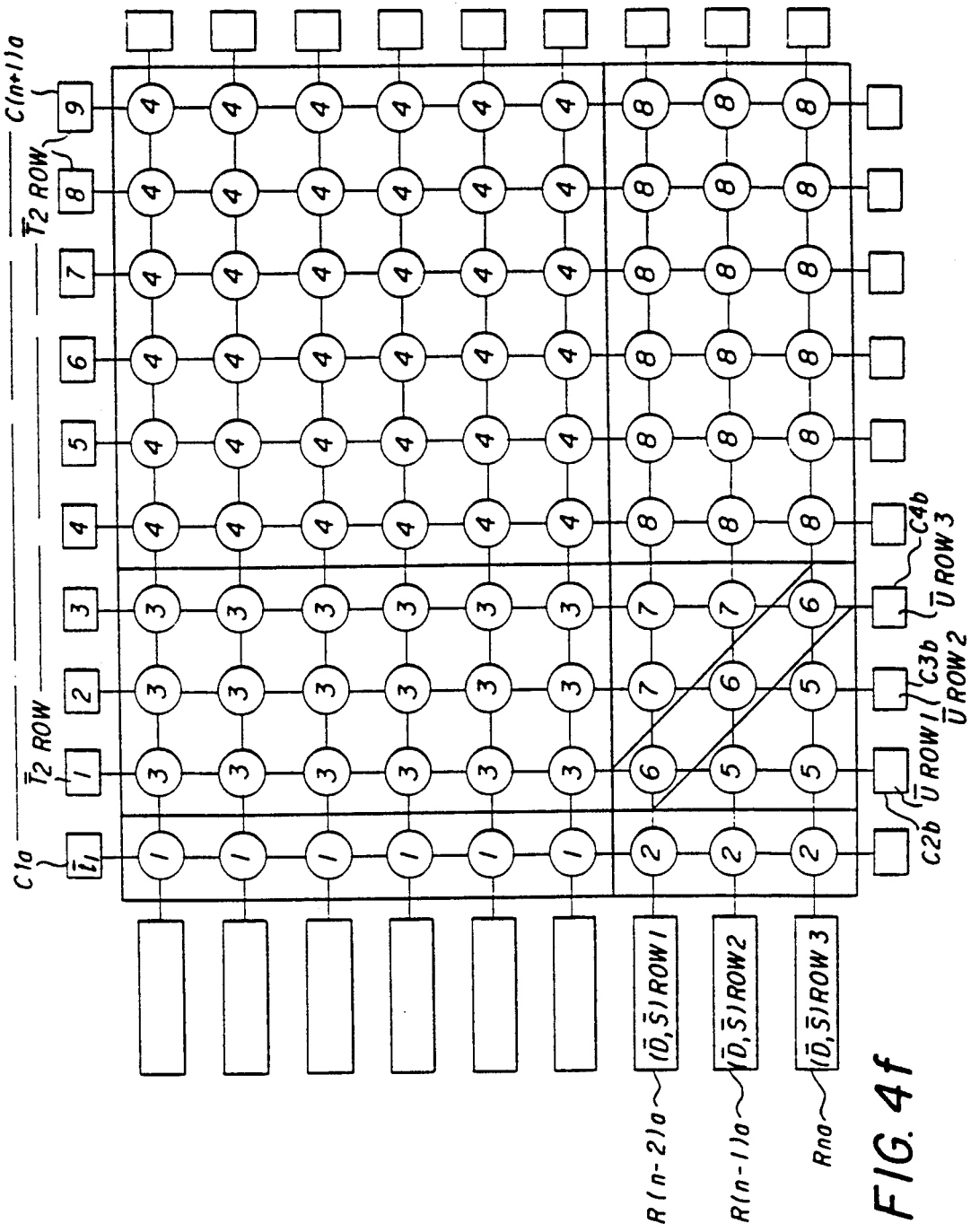
Figure 4G:
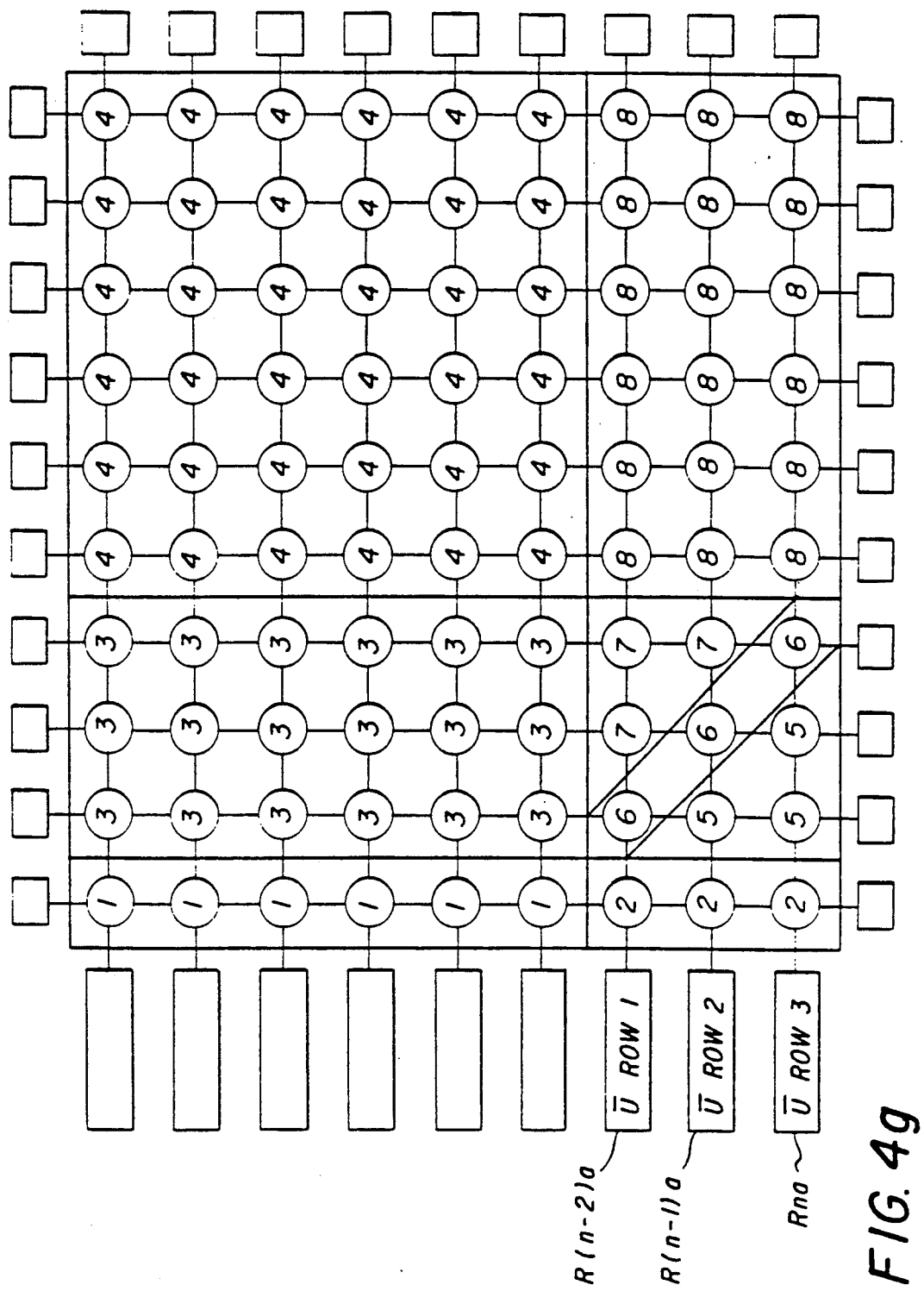
Figure 4H:
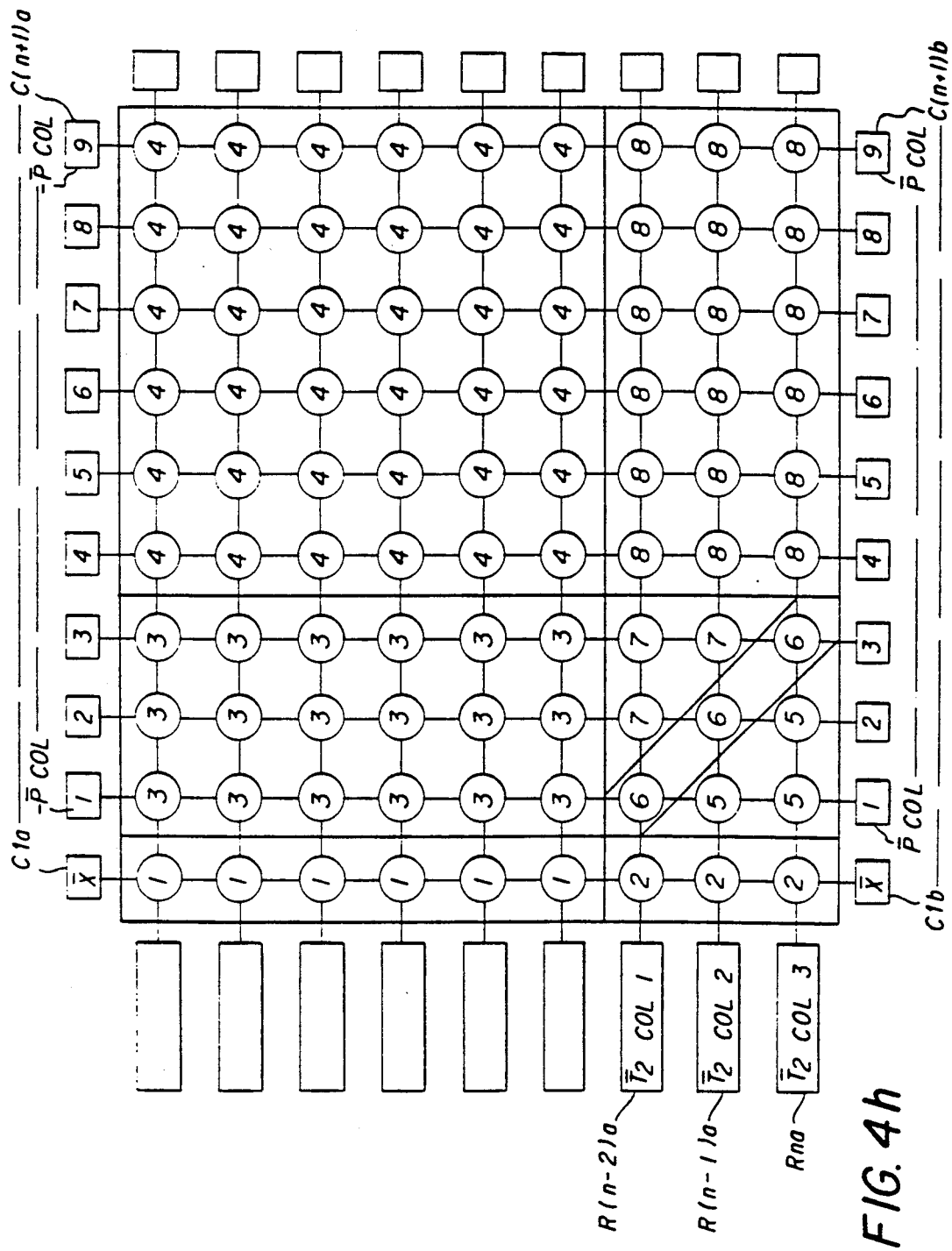
Figure 5A:
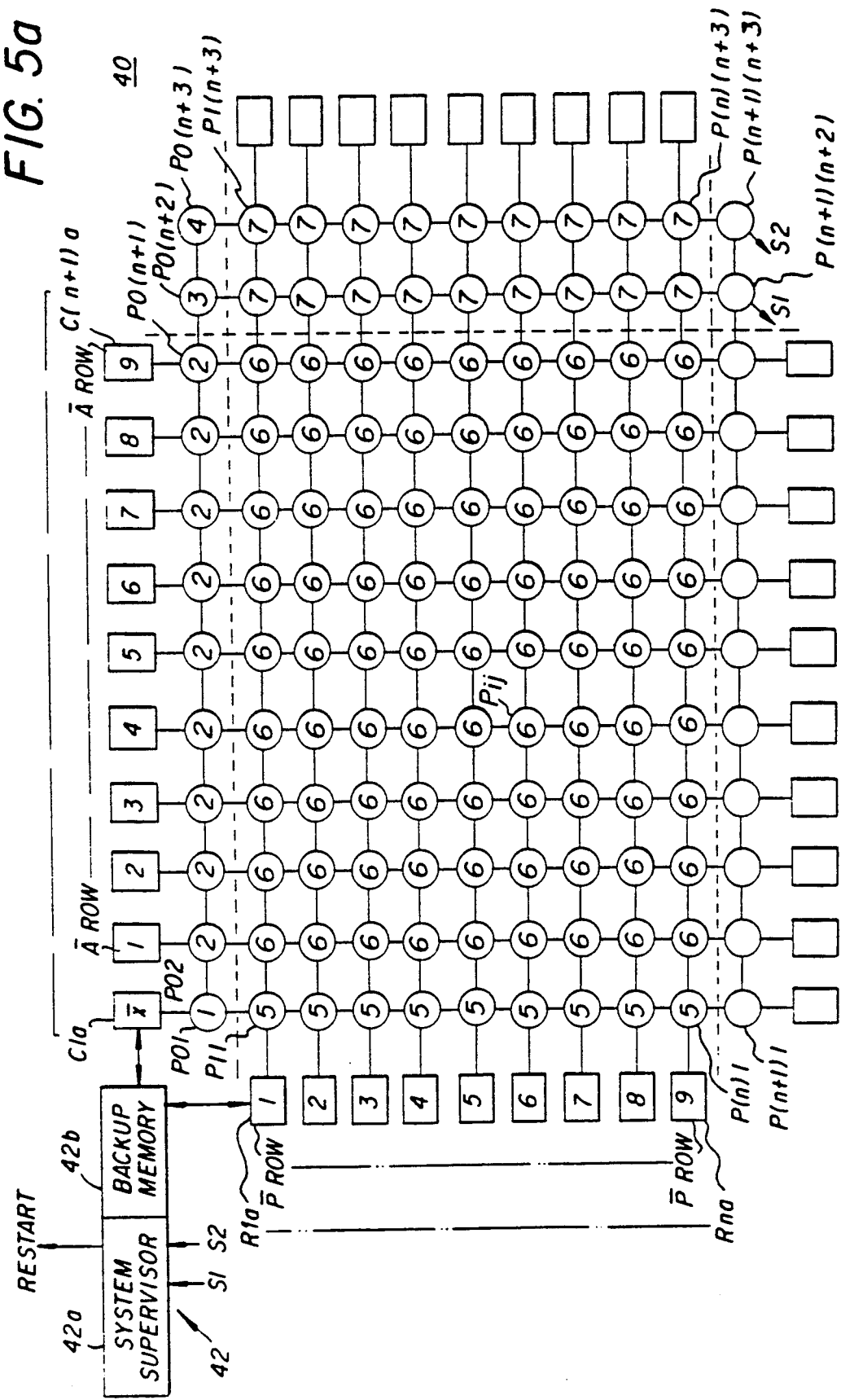
Figure 5C:
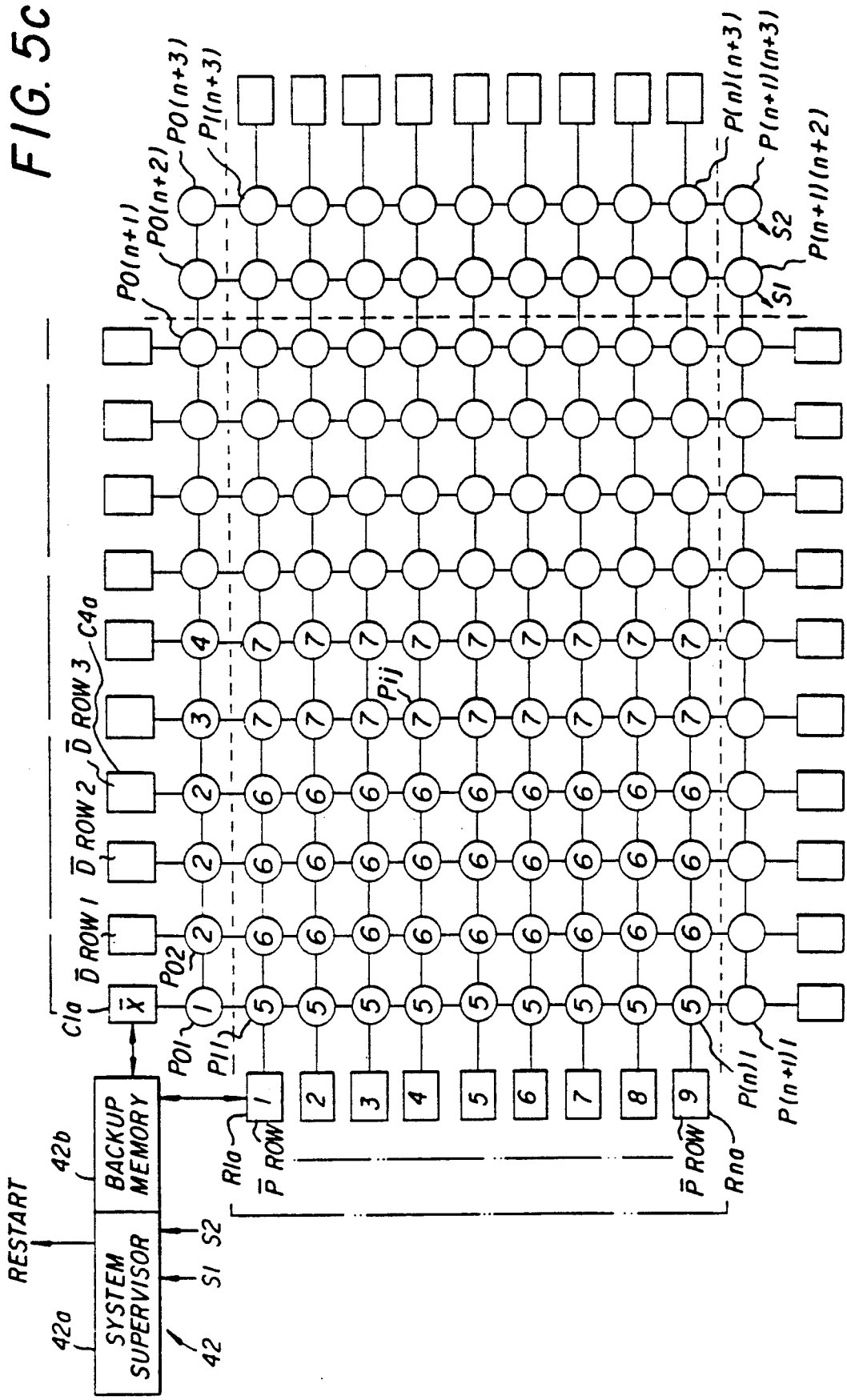
Figure 5D:
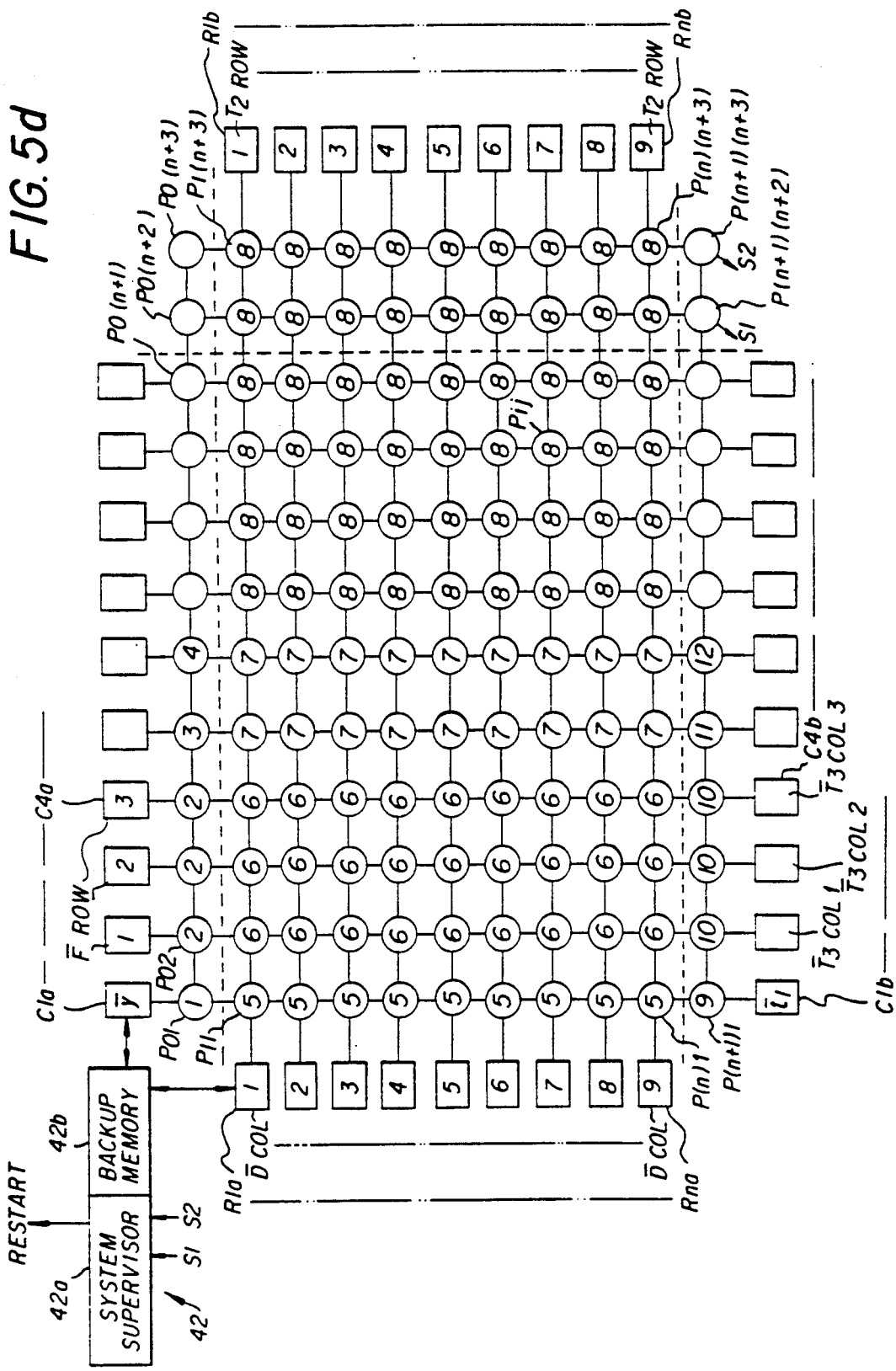
Figure 5E:
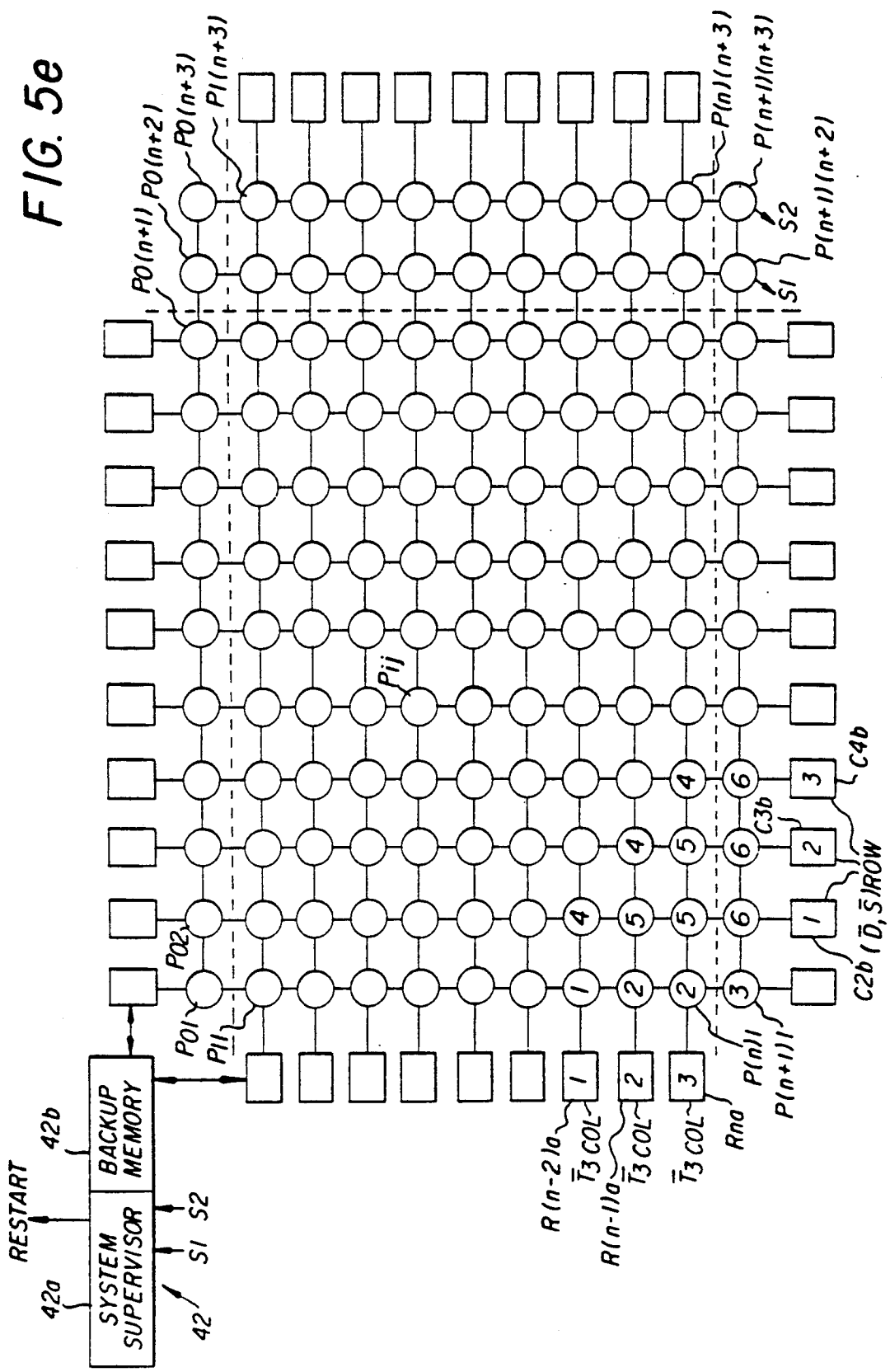
Figure 5F:
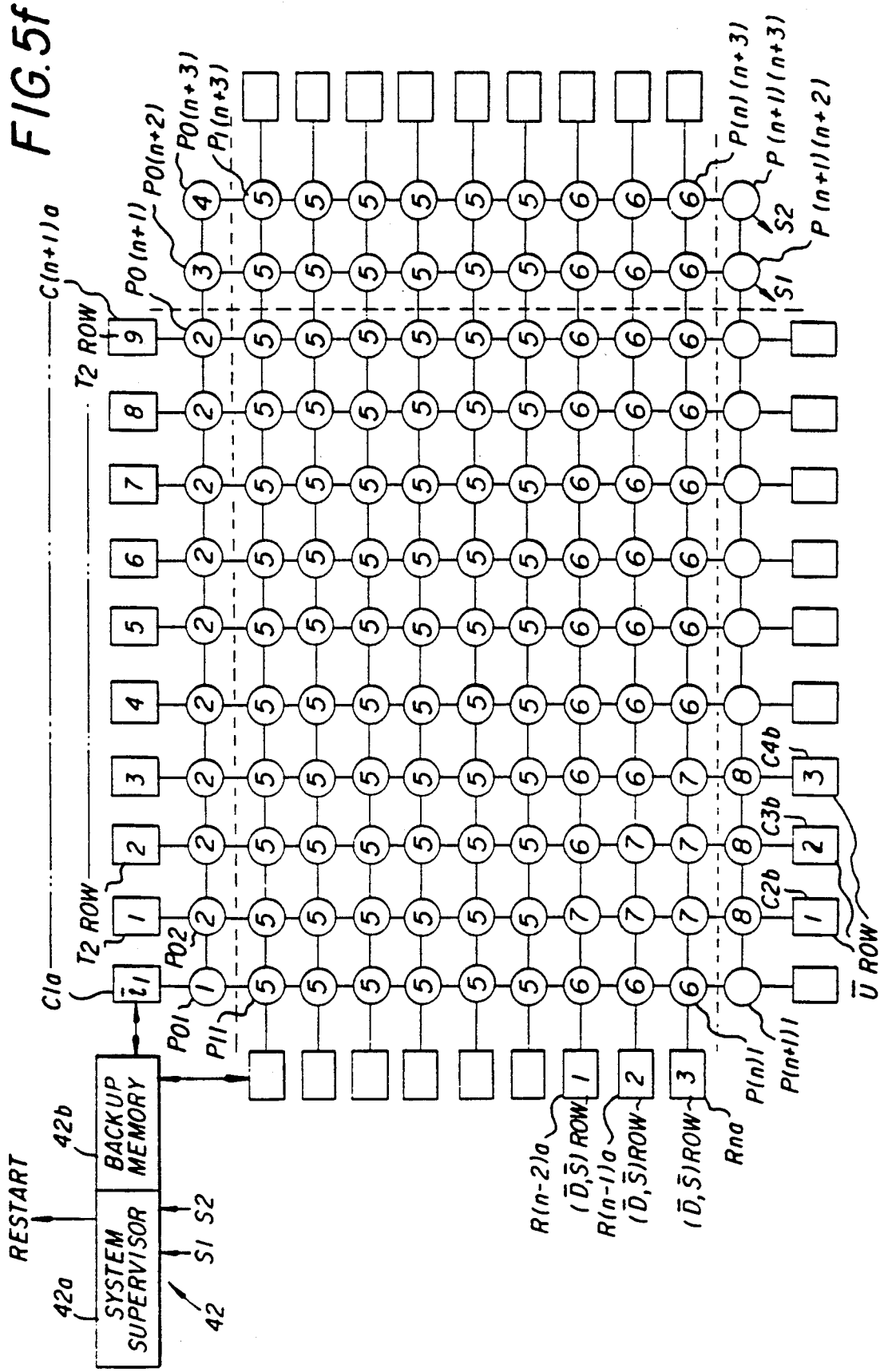
Figure 5G:
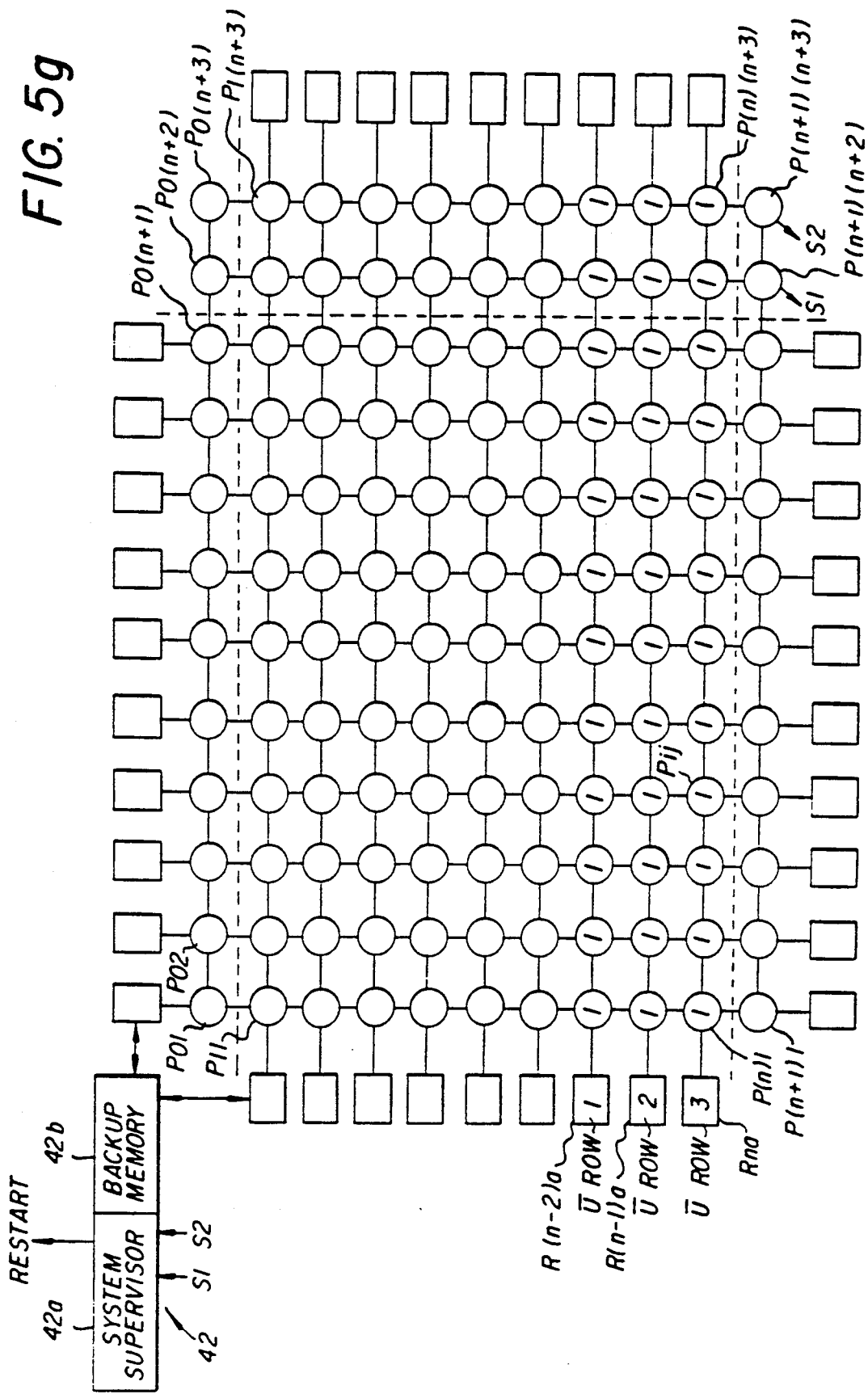

The filter operates in accordance with the overall data flow shown in flow chart 30 of FIG. 3. In the first, or start-up, step 31, the state vector X̅ is initialized, as are the system-defined transition matrices A̅ and D̅ for the particular linear system. The filter loop commences with step 33, when the next state measurement data is obtained and input to the filter 10. The measurement data is stored in the Y̅ memory (i.e. C1a) of the upper left PE (i.e. P11), in step 35. Then the measurement data is used in the next eight-step synchronized pass through the Kalman filter systolic array, in step 37. After all eight steps are finished, the output state vector X̅ is read, in step 39, from the memory register (i.e. C1b) of the lower left PE.

The specific operations and data memory access required for each PE class and each step are shown in FIGS. 4a-4h. These figures, together with the fundamental algorithms presented earlier, fully describe the operation of the Kalman filter systolic array. Thus, to carry out the operations and data memory accesses in Pass #1 (FIG. 4a), the X̅ input data is applied to the leftmost column register C1a and each of the N rows of the A̅ matrix is applied to the associated one of remaining top column registers C2a-C(n+1)a, with each of the N rows of the P̅ matrix being applied to the associated one of the row registers R1a-Rna; the PEs of Classes 1 and 2 perform a "Load Down and Pass Right" operation, while the Class 2-8 PEs do a "SRMM" operation.

For Pass #2 (FIG. 4b), the updated $\overline{X}$ data is now applied to lower column register C1b and each of the N rows of the updated $\overline{P}$ matrix is applied to the associated one of remaining lower column registers C2b-C(n+1)b, with a zero vector being applied to top column register C1a and each of the N rows of the $\overline{Q}$ matrix being applied to the associated one of remaining top column registers C2a-C(n+1)a, and with each of the N columns of the $\overline{A}$ matrix now being applied to the associated one of the row registers R1a-Rna; all 8 Classes of PE do a "MRMM" operation.

In Pass #3 (FIG. 4c), the negative of the updated $\overline{X}$ data from Pass #2 is applied to the leftmost column register C1a and each of the d (e.g. three) rows of the $\overline{D}$ matrix is applied to the associated one of remaining top column registers C2a-C(d+1)a, with each of the N rows of the updated $\overline{P}$ matrix from Pass #2 being applied to the associated one of the row registers R1a-Rna; the PEs in Classes 1 and 2 do another "Load Down and Pass Right" operation, while the Class 3 and 5-7 PEs do a "SRMM" operation and the Class 4 and 8 PEs do a "NULL" operation.

In Pass #4 (FIG. 4d), the $\overline{y}$ data is applied to the leftmost column register C1a and each of the f (e.g. three) columns of the $\overline{F}$ matrix is applied to the associated one of remaining top column registers C2a-C(f+1)a, with the $\bar{t}_1$ data being applied to the leftmost lower column register C1b and each of the t (e.g. three) columns of the $\overline{T}_3$ matrix is applied to the associated one of remaining lower column registers C2b-C(t+1)b; each of the N columns of the $\overline{D}$ matrix is applied to the associated one of the left row registers R1a-Rna and each of the N rows of the $\overline{T}_2$ matrix is applied to the associated one of the right row registers R1b-Rnb. The PEs in Classes 1 and 2 do a "MRMM" operation, while the Class 3 and 5-7 PEs do a "MRMM and Empty Right" operation and the Class 4 and 8 PEs do a "Pass Right" operation.

In Pass #5 (FIG. 4e), each of the t (e.g. three) columns of the $\overline{T}_3$ matrix is applied to the associated one of last t row registers R(n-t+1)a-R(n)a and each of the cs (e.g. three) rows of the $(\hat{C},\hat{S})$ matrix is applied to the second to the (cs+1)-th lower column registers C2b-C(cs+2)b, PEs in Classes 1, 3, 4, 7 and 8 do a "NULL" operation, while the Class 2 PEs do a "Pass Right" operation, the Class 5 PEs do a "QR(int)" operation and the Class 6 PEs do a "QR(diag)" operation.

In Pass #6 (FIG. 4f), the $\bar{t}_1$ data is applied to the leftmost upper column register C1a and each of the N rows of the $\overline{T}_2$ matrix is applied to the associated one of remaining upper column registers C2a-C(n+1)a, each of the cs (e.g. three) rows of the $(\hat{C},\hat{S})$ matrix is applied to the associated one of lower row registers R(n-cs+1)a-R(n)a and each of the u (e.g. three) rows of the $\overline{U}$ matrix is applied to the second to the (u+1)-th lower column registers C2b-C(u+2)b; PEs in Classes 1, 3 and 4 do a "Pass Down" operation, while the Class 2, 7 and 8 PEs do a "QM" operation and the Class 5 and 6 PEs do a "QM and Empty Down" operation.

In Pass #7 (FIG. 4g), each of the u (e.g. three) rows of the $\overline{U}$ matrix is applied to the associated one of lower row registers R(n-u+1)a-R(n)a; PE Classes 1, 3 and 4 do a "NULL" operation and the remaining Classes 2 and 5-8 do a "Uinv" operation.

Finally, in Pass #8 (FIG. 4h), each of the t (e.g. three) columns of the $\overline{T}_2$ matrix is applied to the associated one of lower row registers R(n-t+1)a-R(n)a, the updated $\overline{X}$ data from Pass #2 is applied to the leftmost upper column register C1a, each of the N columns of the updated $\overline{P}$ matrix from Pass #2 is applied to the associated one of remaining top column registers C2a-C(n+1)a, the final $\overline{X}$ output data is applied to the leftmost lower column register C1b, and each of the N columns of the final $\overline{P}$ matrix is applied to the associated one of the remaining bottom column registers C2b-C(n+1)b; PEs in Classes 1, 3 and 4 do a "Pass Down" operation, while the Class 2 and 5-8 PEs do a "MRMM" operation.

The steps can be better understood by noting that:

(1) In general, vectors, matrix rows, and matrix columns are passed into the array in forward order, i.e., with the first value first and the N-th value last. The exception is in the matrix $\overline{U}$inv where the end of the row is passed in first and the beginning of the row (diagonal entry) is passed in last.

(2) Synchronization of the array is accomplished through the passing of data. Thus, a "get" command includes a "wait for the data to become available" substep, and a "send" command includes a "wait for the previously sent data to be used" substep. On the array boundary, reading PEs must wait for updated vector and matrix values to be written by writing PEs. A flag is associated with each memory word indicating whether or not a value is ready to be read. In general, the flag of a particular memory is set when a value is written to that memory by a PE, and the flag is cleared when the value stored in that memory is read out by a PE. The exceptions where the flag is not cleared are matrices $\overline{P}$ and $\overline{X}$ in step 3 and $\overline{T}_2$ in step 6, where the values will be used again before they are updated. Also, flags are not used with the constant matrices $\overline{A}$, $\overline{D}$, $\overline{Q}$ and $\overline{E}$.

(3) In step 2, ZERO is a vector formed of a plurality N of zeros.

(4) Some steps, such as step 1 for PE class 1, involve merging two of the fundamental algorithms. This involves interleaving the lines of the algorithms, and possibly modifying the looping structure. For example, a merged step of "Load down and Pass right" may be programmed as:

```
for loop = 1 to PE_row − 1
  get B from left port
  send B right
endfor
get A from top port and B from left port
register = A
send B right
for loop = PE_row+1 to N
  get A from top port and B from left port
  send A down and B right
endfor
```

(5) The matrix $\overline{P}$ is symmetric, thus the rows of $\overline{P}$ are the same as the columns of $\overline{P}$, and a data memory labeled "$\overline{P}$ row i" (as in step 1) is the same memory as one labeled "$\overline{P}$ col i" (as in step 2).

(6) The matrices $\overline{A}$ and $\overline{D}$ also need to be accessed both by row and by column. These matrices can each be stored in two memories, one by row and one by column, since they are constant for any one system 11 in which a particular Kalman filter operates, and there is no concern about updating two locations.

(7) The matrix $\overline{T}_2$ needs to be accessed by row in step 6 and by column in step 8. It is written by row in step 4, ready for step 6, and can be copied by a small number of other processors to a second memory, accessible by column, in the amount of time available before step 8.

(8) Matrices $\overline{X}$ in step 3 and $\overline{P}$ in step 8 must be negated before reading and writing. The programs in the boundary PEs include instructions to perform this operation.

(9) When the algorithm calls for passing a value to the next processor and either (1) the next processor is NULL during this step, or (2) this processor is on the boundary and there is no memory write during this step, the algorithm program in that particular processor is modified to remove the "send" command.

A careful analysis of the flow of data through the Kalman filter systolic array reveals the number of cycles required per iteration. A cycle is defined to be the operations that occur in one processor with one pair of data. For example, in a stationary result matrix multiplication (SRMM) step, one cycle consists of two get operations, one multiplication operation, one addition operation, and two send operations. By determining the maximum time required for any one cycle, one can estimate the speed of the systolic array using the cycle counts that follow. Table 1 shows the starting and ending cycle number for each of the steps of the present Kalman filter processing algorithm. In steps 6 and 8, the start time is the beginning of the actual computation in PE class 2, not the beginning of passing the data down through class 1, 3 and 4 PEs. The max $\{0, N-2M-2\}$ term arises in step 6 because whether the top or left datum is the first to arrive at the first class 2 PE depends on the relationship between N and M. It is seen that one complete iteration requires a total of $(6N+6M+1+\max\{0, N-2M-2\})$ cycles.

However, due to the overlap of computations between iterations, the latency between beginnings of iterations is $(4N+6M+3+\max\{0, N-2M-2\})$. For the example of tracking with radar, $N=9$ and $M=3$, so that each iteration uses 58 cycles before the next iteration can begin.

TABLE 1

Starting/Ending Cycle Numbers of Each Step
"max" = max{0,N−2M−2}

| Step | Start # | End # |
| --- | --- | --- |
| 1 | 1 | 3N−1 |
| 2 | N+1 | 4N−1 |
| 3 | 2N+2 | 4N+M |
| 4 | 3N+2 | 5N+M |
| 5 | 4N+3 | 4N+3M+1 |
| 6 | 4N+M+4+"max" | 5N+3M+2+"max" |
| 7 | 4N+3M+4+"max" | 5N+5M+2+"max" |
| 8 | 4N+5M+3+"max" | 6N+6M+1+"max" |
| 1 | 4N+6M+4+"max" | 7N+6M+2+"max" |

In some applications, the signal processing system is required to continue to function even after some of the system components have failed. A Kalman filter systolic array which is tolerant of faults is based on the use of extending the Kalman filter equations by row-weighted checksums to allow detection of incorrect results, as well as the location of the faulty processing element. Thus, infrequent transient faults will not affect the ability of the fault-tolerant Kalman filter systolic array to produce a correct result; the faulty processor is located so that the system can be reconfigured around the bad processor if the faults occur more frequently than a preselected limit. This fault-tolerant approach has a price: an additional 47% extra hardware and 17% extra computational steps in the radar tracking example (although known "traditional" approaches require 100–300% additional overhead).

I extend equations (3a)–(3h) by use of row-weighted checksum techniques to allow the detection of an erroneous result due to a single processor fault and location of the column in which the faulty processing element is located. If $\overline{e}=(1\ 1\ \ldots\ 1)^T$ and $\overline{w}=(2\ 3\ \ldots\ n)^T$, where n is either N or M depending on the situation, then the row-weighted checksum extension of equations (3a)–(3h) is:

$$[\overline{T}_1|\overline{T}_1\overline{e}|\overline{T}_1\overline{w}]=\overline{A}[\overline{A}^T|\overline{A}^T\overline{e}|\overline{A}^T\overline{w}] \quad (4a)$$

$$[\overline{x}|\overline{P}|\overline{P}\overline{e}+\overline{x}|\overline{P}\overline{w}+\overline{x}]=\overline{A}[\overline{x}|\overline{T}_1|\overline{T}_1\overline{e}+\overline{x}|\overline{T}_1\overline{w}+\overline{x}] +[\overline{0}|\overline{Q}|\overline{Q}\overline{e}|\overline{Q}\overline{w}] \quad (4b)$$

$$[\overline{T}_2|\overline{T}_2\overline{e}|\overline{T}_2\overline{w}]=\overline{P}[\overline{D}^T|\overline{D}^T\overline{e}|\overline{D}^T\overline{w}] \quad (4c)$$

$$[\overline{r}_1|\overline{T}_3|\overline{T}_3\overline{e}+\overline{r}_1|\overline{T}_3\overline{w}+\overline{r}_1]=\overline{D}[-\overline{x}|\overline{T}_2| \overline{T}_2\overline{e}-\overline{x}|\overline{T}_2\overline{w}-\overline{x}]+[\overline{y}|F|F\overline{e}+\overline{y}|F\overline{w}+\overline{y}] \quad (4d)$$

$$\hat{Q}[\hat{F}|\hat{F}\overline{e}]=[\overline{T}_3|\overline{T}_3\overline{e}] \quad (4e)$$

$$[\overline{r}_2|\overline{T}_4|\overline{T}_4\overline{e}+\overline{r}_2|\overline{T}_4\overline{w}+\overline{r}_2]=\hat{Q}^T[\overline{r}_1|\overline{T}_2^T|\overline{T}_2^T\overline{e}+\overline{r}_1|\overline{T}_2^T\overline{w}+\overline{r}_1] \quad (4f)$$

$$[\overline{r}_3|\overline{T}_5|\overline{T}_5\overline{e}+\overline{r}_3|\overline{T}_5\overline{w}+\overline{r}_3]=\hat{F}^{-1}[\overline{r}_2|\overline{T}_4| \overline{T}_4\overline{e}+\overline{r}_2|\overline{T}_4\overline{w}+\overline{r}_2] \quad (4g)$$

$$[\overline{x}|\overline{P}|\overline{P}\overline{e}+\overline{x}|\overline{P}\overline{w}+\overline{x}]=\overline{T}_2[\overline{r}_3|-\overline{T}_5|- \overline{T}_5\overline{e}+\overline{r}_3|-\overline{T}_5\overline{w}+\overline{r}_3]+[\overline{x}|P|P\overline{e}+\overline{x}|P\overline{w}+\overline{x}] \quad (4h)$$

The addition to the matrices of the row-weighted checksum allows detection of both an error due to a fault in a PE, and the location of the column in which the faulty processor is located. If a row-weighted checksum matrix has a single erroneous element, then that error can be detected by use of the fact that $$(Aw)_i - <a_i, w> = w_j((Ae)_i - <a_i, e<)$$

if the error is in the i-th row and the j-th column, where $(Ax)_i$ is the i-th element of a checksum column, $a_i$ is the i-th row of the information matrix, and $<.,.>$ is the usual $L_2$ inner product. That is, with the weighting $w_i = i$, the ratio of the errors in the checksum columns gives the column in which the error is located. It is thus not necessary to verify the correctness of the result of all eight equations (4a)–(4h) in order to determine if a fault has occurred and to localize the fault to a particular column of the array. The checksums need only be examined in those equations (i.e. equations 4b, 4d, 4e and 4h) for which a result is passed out of the systolic array. When a discrepancy in the checksums is detected, a system supervisor is notified, and is sent the difference between the checksums. The ratio of the weighted checksum difference and the unweighted checksum difference points to the column in which the fault occurred. This system supervisor is also responsible for correcting the erroneous result. Due to the pipeline nature of the systolic array, the erroneous result will have already been used in computation of the next equation. Thus, correction requires some roll back of computation. To avoid complicated restart logic and duplication of all variable data structures, a simple approach can be used to always roll back the computation to equation 4a. The restart logic is simple, and only $\overline{P}$ and $\overline{x}$ need to be backed up in memory.

The assumption with this corrective action is that the faults occur infrequently and the sensor measurements arrive at a slower rate than the throughput of the systolic array. Under these assumptions the systolic array should be able to catch up with the measurements after a short period of time. It is possible that a processor may begin to have frequent faults. The system supervisor monitors the frequency of faults in each column of processors, and determines if the system should be reconfigured to circumvent the faulty column.

As seen in FIGS. 5a–5h, a fault-tolerant Kalman filter systolic array is an $(N \times 2) \times (N+3)$ rectangular array of processing elements 24, with each PE Pij connected to the four nearest neighbors with a 2 word data channel, similar to the array shown in FIG. 2. In general, the top row, bottom row and right two columns are used for checksum calculations for fault tolerance, and the remainder of the array computes the Kalman filter. Therefore, fault-tolerant array 40 includes an additional two columns of PEs at the righthand end of the array (i.e. the $(n-2)$-nd and $(n+3)$-rd columns) and an additional two PE rows, with one row being added as an uppermost (i.e. zero-th) row prior to the first row, and the second additional row being added after the former last (n-th) row and being a lowest (i.e. $(n+1)$-st) row. Thus, the processing elements range from element P01 at the upper left array corner, to element $P(n+1)(n+3)$ at the lower right corner. The same number and location (column connection) of upper and lower column register memories C1a–C(n+1)a and C1b–C(n+1)b are present, as are the same number and row connections of left and right row register memories R1a–Rna and R1b–Rnb. A supervisor means 42, including the above discussed system supervisor 42a and back-up memory means 42b (for temporarily storing at least the $\bar{x}$ and $\bar{P}$ digital data), receives the checksum signals S1 and S2 from the respective $(n+2)$nd and $(n+3)$-rd PE columns, and provides the stored $\bar{x}$ and $\bar{y}$ data along with a restart signal, if a fault is detected. As in the normal (non-fault-tolerant) array 10, the boundary PEs are connected to data memories shared with other PEs, and each PE has its own program and a few data registers. Synchronization among the PEs is still accomplished by the passing of data with until the data is available from a neighbor or until a neighbor has accepted the previously sent data.

The individual PE programs implement the several systolic process algorithms described hereinbelow. In these algorithm processes, the generic variables M and N are again not necessarily the same as the number of measurements and states; loops for which the upper limit is less than the lower limit ("zero pass loops") are not executed.

PE Action Type #1

PASS (Top Down, Left Down, Left Right, Top Right, Register Right) are operations which move vector/matrix digital data between PEs without performing any other operations on the data. The first four operations accept data input from one port and output that same data to another port. The last operation writes the data stored in one of the PE registers to the right port of that PE. A typical "pass top (or left) down" data flow sequence might be:

```
for loop = 1 to N
   get A̅ from top (left) port
   send A̅ down
endfor
``` while a typical "pass left (or top) right" data flow sequence:

```
for loop = 1 to N
   get A̅ from left (top) port
   send A̅ right
endfor
``` and a typical "pass register right" data flow sequence needs only the single command "send register right".

PE Action Type #2

PASS (0,0) Right, Double pass Top Right, Split Left Down and Right are similar to the previous set of operations, but specifically apply to use of both data channels. The "pass (0,0) right" operation simply writes a zero N times to both data channels on the right; a typical data flow sequence is:

```
for loop = 1 to N
   send (0,0) right
endfor.
```

The "double pass top right" operation accepts one data value from the top port and writes that same data to both data channels exiting from the right port of the same PE; a typical data flow sequence might be:

```
for loop = 1 to N
   get A̅ from top port
   send (A̅,A̅) right
endfor.
```

The "split left down and right" operation accepts data from both channels entering at the left port of the PE and writes the first channel data to the bottom port while writing the second channel data to the right port; one typical flow sequence could be:

```
for loop = 1 to N
   get (A̅,B̅) from left port
   send A̅ down and B̅ right
endfor.
```

PE Action Type #3

Checksum: Weighted or Vertical, are operations which compute the checksum vectors used for detecting faults. In the weighted checksum, a pair of partial checksums is accepted from the left port and a data value is input from the top port. The data value is added to the first partial checksum, and the data value multiplied by the column index of the PE is added to the second partial checksum; its typical data flow sequence is:

```
for loop = 1 to N
   get A̅ from top port and (D̅1,D̅2) from left port
   send A down and (D̅1+A̅,D̅2+A̅*PE_col) right
endfor.
```

The vertical checksum is similar, but only the unweighted checksum is computed, the data moves from left to right, and the checksum moves from top to bottom, with a typical sequence of:

```
for loop = 1 to N
    get A̅ from left port and D̅ from top port
    send A right and D̅+A̅ down
endfor.
```

PE Action Type #4

Load Top Down operation loads a vector A̅, of length N, into a column of N PEs for later processing. The top PE in the column receives the first datum, second PE receives the second datum, and so on in sequence. A typical data flow sequence is:

```
get A̅ from top port
register = A̅
for loop = 1 to N-PE_row
    get A̅ from top port
    send A̅ down
endfor.
```

PE Action Type #5

Stationary Result Matrix Multiplication operation computes the product of an N×L array G̅ with an L×M array H̅ in an N×M systolic array. The rows of G̅ are passed in the left side of the systolic array and the columns of H̅ are passed in the top. The product ends up in the array. One possible flow sequence is:

```
register = 0
for loop = 1 to L
    get G̅ from left port and H̅ from top port
    register = register + G̅*H̅
    send G̅ right and H down
endfor
```

PE Action Type #6

Add Left to Register or Subtract Top From Register—are simple arithmetic operations with data flowing through the array. The "Add Left To Register" operation can be done with:

```
get A̅ from left
register = register + A̅
send A̅ right
``` and the "Subtract Top From Register" operation with:

```
for loop = 1 to N
    get A̅ from top port
    register = register − A̅
    send A̅ down
endfor.
```

PE Action Type #7

Moving Result Matrix Multiplication computes the product and sum G̅H̅+J̅ where G̅ is an N×L array, H̅ is an L×M array and J̅ is an N×M array, by use of an L×M systolic array. H̅ is resident in the array registers initially. The columns of G̅ are passed in the left side of the array and the columns of J̅ are passed in the top. A typical sequence is:

```
for loop = 1 to N
    get G̅ from left port and J̅ from top port
    send G̅ right and G̅*register+J̅ down
endfor,
``` with the result coming out of the bottom of the array.

PE Action Type #8

Unweighted Check, Weighted Check, Zero Check, Check C2+S2 are all checks to determine if a fault has occurred. The "unweighted check" can be accomplished with the command sequence:

```
for loop = 1 to N
    get (D̅1,D̅2) from left port and D̅ from top port
    is abs(D̅1−D̅) > roundoff tolerance then send D̅1−D̅ to system
                                                    supervisor
    send D̅ right
endfor
``` and the "weighted check" with:

```
for loop = 1 to N
    get D̅2 from left port and D̅ from top port
    if abs (D̅2−D̅) > roundoff tolerance then send D̅2−D̅ to system
                                                    supervisor
endfor.
```

The "zero check" procedure can be implemented with the command:

```
if abs(register) > roundoff tolerance
    then notify system supervisor,
``` and the "check C2+S2" operation with the program sequence:

```
get (Ĉ,Ŝ) from top port
if abs (Ĉ*Ĉ+Ŝ*Ŝ−1) > roundoff tolerance then notify system
supervisor
send (Ĉ,Ŝ) down.
```

PE Action Type #9

Empty Register Right or Empty Register Down are algorithms for removing data resident in the systolic array. The data in the left column (top row) of processors is the first to leave the array. The "empty register right" (or the "empty register down") program may be:

```
for loop = 1 to PE_col−1 (row−1)
    get A̅ from left (top) port
    send A̅ right (down)
endfor
send register right (down).
```

PE Action Type #10

QR diagonal, QR interior, Q Multiply, U Inverse Multiply are all algorithmic processes which multiply by the inverse of a matrix, by performing a QR decomposition of the matrix, multiplying by Q̅ transpose and then multiplying by U̅ (or U̅ inverse). The QR algorithm is done in two parts: the first is performed by the "diagonal" elements and the second by the "interior" elements. The "QR diagonal" process sequence I use is:

```
for loop = 1 to N
```

```
for loop = 1 to N
  get Ā from left port
  if loop = 1 then
    if  A = 0 then
        Ĉ = 1
        Ŝ = 0
        register = 0
    else
        Ĉ = 0
        Ŝ = sgn(A)
        register = abs(A)
    endif
  else
    if  A = 0 then
        Ĉ = 1
        Ŝ = 0
    else
        r' = sqrt(register*register + A*A)
        Ĉ = register/r'
        Ŝ = A/r'
        register = r'
    endif
  endif
  send (Ĉ,Ŝ) down
endfor.
```

The "QR interior" process could be:

```
register = 0
for loop = 1 to N
  get Ā from left port and (Ĉ,Ŝ) from top port
  temp = Ĉ*Ā − Ŝ*register
  register = Ŝ*A + Ĉ*register
  send temp right and (Ĉ,Ŝ) down
endfor,
``` the "Q multiply" by:

```
register = 0
for loop = 1 to N
  get (Ĉ,Ŝ) from left port and A from top port
  temp = Ĉ*A − Ŝ*register
  register = Ŝ*A + Ĉ*register
  send (Ĉ,Ŝ) right and temp down
endfor,
``` and the "U inverse multiply" by:

```
for loop = 1 to M−PE_row
  get Ū from left port and B̄ from bottom port
  register = register − Ū*B
  pass Ū right and B up
endfor
get Ū from left port
register = register/Ū
pass Ū right and register up.
```

The PE programs are illustrated in FIGS. 5a–5h, with each Figure corresponding to a pass through the array and thus to one of the eight equations 4a–4h; each is designated as step 1, for equation 4a, through step 8, for equation 4h. At each step, several PEs execute the same algorithm. Unlabeled PEs are idle during this step. In many cases, a few operations are combined to form the algorithm for one step for one processor. Operations combined with the "&" symbol are interleaved. When two operations are separated by a comma, the first is executed to completion, and then the second is executed. For example, in step 1 processors labeled 5 execute "Load Top Down and Pass Left Right, Pass Register Right" for which the operations, as described above, can be combined in a program given by:

```
for loop = 1 to PE_row − 1
  get Ā from left port
  send A right
endfor
get Ā from left port and B̄ from top port
register = B̄
send Ā right
for loop = 1 to N − PE_row
  get Ā from left port and B̄ from top port
  send Ā right and B̄ down
endfor
send register right
```

The specific operations and data memory access required for each PE class and each step are shown in FIGS. 5a–5h. Each of these figures, together with the associated fundamental algorithm equation (5a)–(5h), fully describe the operation of the fault-tolerant Kalman filter systolic array. Thus, to carry out the operations and data memory accesses in Pass #1 (FIG. 5a), the X̄ input data is applied to the leftmost column register C1a and each of the N rows of the Ā matrix is applied to the associated one of remaining top column registers C2a–C(n+1)a, with each of the N rows of the P̄ matrix being applied to the associated one of the row registers R1a–Rna; there are seven classes of active processors in this pass, performing the following functional actions:

| PE CLASS | Operation |
| --- | --- |
| 1 | Pass Top Down & Pass (0,0) Right |
| 2 | Weighted Checksum |
| 3 | Split Left Down and Right |
| 4 | Pass Left Down |
| 5 | Load Top Down & Pass Left Right Pass Register Right |
| 6 | SRMM, Pass Left Right |
| 7 | SRMM, Add Left to Register. |

For Pass #2 (FIG. 5b), the updated X̄ data is now applied to lower column register C1b and each of the N rows of the updated P̄ matrix is applied to the associated one of remaining lower column registers C2b–C(n+1)b, with a zero vector being applied to top column register C1a and each of the N rows of the Q̄ matrix being applied to the associated one of remaining top column registers C2a–C(n+1)a, and with each of the N columns of the Ā matrix now being applied to the associated one of the row registers R1a–Rna; there are nine classes of active processors in this pass, with Classes 1–4 performing the same operations as they each performed in Pass 1, and with the remaining classes performing the following functional actions:

| PE CLASS | Operation |
| --- | --- |
| 5 | MRMM |
| 6 | Pass Top Down & Double Pass Top Right |
| 7,9 | Weighted Checksum |
| 8 | Unweighted Checksum. |

In Pass #3 (FIG. 5c), the updated X̄ data from Pass #2 is applied to the leftmost column register C1a and each of the d (e.g. three) rows of the D̄ matrix is applied to the associated one of remaining top column registers C2a–C(d+1)a, with each of the N rows of the updated P̄ matrix from Pass #2 being applied to the associated one of the row registers R1a-Rna; there are the same seven classes of active PEs as in Pass #1, performing the exact same operations.

Pass #4 (FIG. 5d) is the most "active" of the passes, as all four array-edge register sets, and twelve different operations classes, are in use. The y data is applied to the leftmost column register C1a and each of the f (e.g. three) columns of the F̄ matrix is applied to the associated one of remaining top column registers C2a-C(f+1)a, with the t̄₁ data being applied to the leftmost lower column register C1b and each of the t (e.g. three) columns of the T̄₃ matrix is applied to the associated one of remaining lower column registers C2b-C(t+1)b; each of the N columns of the D̄ matrix is applied to the associated one of the left row registers R1a-Rna and each of the N rows of the T̄₂ matrix is applied to the associated one of the right row registers R1b-Rnb. The first four PE classes perform the same operations as in the first pass; Class 5-12 operations are:

| PE CLASS | Operation |
|---|---|
| 5 | MRMM |
| 6 | MRMM & Empty Register Right |
| 7 | MRMM & Pass Left Right |
| 8 | Pass Left Right |
| 9 | Pass Top Down & Double Pass Top Right |
| 10, 12 | Weighted Checksum |
| 11 | Unweighted Checksum. |

In Pass #5 (FIG. 5e), each of the t (e.g. three) columns of the T̄₃ matrix is applied to the associated one of last t row registers R(n−t+1)a-R(n)a and each of the cs (e.g. three) rows of the (Ĉ,Ŝ) matrix is applied to the second to the (cs+1)-th lower column registers C2b-C(cs+2)b. The six classes of PE means carry out the following operations:

| PE CLASS | Operation |
|---|---|
| 1 | Pass Left Down & Pass Left Right |
| 2 | Vertical Checksum |
| 3 | Pass Top Right |
| 4 | QR diagonal |
| 5 | QR interior |
| 6 | QR interior & Check (C2+S2). |

In Pass #6 (FIG. 5f), the t̄₁ data is applied to the leftmost upper column register C1a and each of the N rows of the T̄₂ matrix is applied to the associated one of remaining upper column registers C2a-C(n+1)a, each of the cs (e.g. three) rows of the (Ĉ,Ŝ) matrix is applied to the associated one of lower row registers R(n−cs+1)a-R(n)a and each of the u (e.g. three) rows of the Ū matrix is applied to the second to the (u+1)-th lower column registers C2b-C(u+2)b. The eight PE classes do the following operations:

| PE CLASS | Operation |
|---|---|
| 1 | Pass Top Down & Double Pass Top Right |
| 2 | Weighted Checksum |
| 3 | Split Left Down and Right |
| 4 | Pass Left Down |
| 5 | Pass Top Down |
| 6 | Q Multiply |
| 7 | Q Multiply & Empty Register Down |
| 8 | Subtract Top from Register, Zero Check. |

In Pass #7 (FIG. 5g), each of the u (e.g. three) rows of the Ū matrix is applied to the associated one of lower row registers R(n−u+1) a-R(n)a; only a single PE class 1 is active, doing a "U Inverse Multiply" operation.

Finally, in Pass #8 (FIG. 5h), each of the t (e.g. three) columns of the T̄₂ matrix is applied to the associated one of lower row registers R(n−t+1)a-R(n)a, the updated X̄ data is applied to the leftmost upper column register C1a, each of the N columns of the updated P̄ matrix from Pass #2 is applied to the associated one of remaining top column registers C2a-C(n+1)a, the final X̄ output data is applied to the leftmost lower column register C1b, and each of the N columns of the final P̄ matrix is applied to the associated one of the remaining bottom column registers C2b-C(n+1)b. There are ten active PE classes, with the first five Classes 1-5 doing the same operations as each of these classes did in Step #7, and with the remaining Classes 6-10 carrying out the following operations:

| PE CLASS | Operation |
|---|---|
| 6 | MRMM |
| 7 | Pass Top Down & Double Pass Top Right |
| 8, 10 | Weighted Checksum |
| 9 | Unweighted Checksum. |

While several presently preferred embodiments of my novel systolic array Kalman filters have been described herein, those skilled in the art will now realize that many modifications and variations can be provided. It is my intent, therefore, to be limited solely by the scope of the appending claims and not by way of the details and instrumentalities presented by way of description herein.

What I claim is:

1. A Kalman filter for a dynamic linear system having a plurality N of different states and another plurality M of observational components, comprising:
   an $N \times (N+1)$ rectangular systolic array of processing element means;
   means for connecting said processing element means of said array in a four-nearest-neighbor network;
   a plurality of memory registers, each connected to a different one of at least some of said processing element means along the periphery of said array for passing data into the array and for receiving data from the array;
   each of said processing element means being configured in a selected one of eight different operational classes, for recurrently performing the eight sequential Kalman-filtering steps of
   during a first step of said eight recurrent sequential Kalman-filtering process steps, multiplying a state covariance matrix P̄ by the transpose of an $N \times N$ state transition matrix $\bar{A}^T$, to form a first temporary matrix T̄₁;
   during a second step, multiplying said $N \times N$ state transition matrix by a first auxiliary matrix $[\bar{x}|\bar{T}_1]$ in which the first column is a state vector, and the remaining columns constitute said first temporary matrix from said first step, to thereby form a first product, and adding to said first product a second auxiliary matrix $[\bar{O}|\bar{Q}]$ in which the first column in a zero vector and the remaining columns constitute a process noise covariance matrix Q̄, to form an updated third auxiliary matrix $[\bar{x}|\bar{P}]$ in which the first column is said state vector x, and the remaining columns constitute said state covariance matrix $\bar{P}$;

during a third step, multiplying said state covariance matrix $\bar{P}$ from said second step by the transpose of a measurement transition matrix $\bar{D}^T$, to thereby form a second temporary matrix $\bar{T}_2$;

during a fourth step, multiplying said measurement transition matrix $\bar{D}$ by a fourth auxiliary matrix $[\bar{x}|\bar{T}_2]$ to form a second product, and summing said second product with a fifth auxiliary matrix $[\bar{y}|\bar{F}]$, said fourth auxiliary matrix having as its first column the negative of said state vector $\bar{x}$ from said second step and its remaining columns constituting said second temporary matrix $\bar{T}_2$ from said third step, said fifth auxiliary matrix having as its first column a measurement vector $\bar{y}$, and as its remaining columns a measurement noise covariance matrix $\bar{F}$, to thereby form a sixth auxiliary matrix $[\bar{t}_1|\bar{T}_3]$ in which the first column is a first temporary vector $\bar{t}_1$ and the remainder of the columns constitute a third temporary matrix $\bar{T}_3$;

during a fifth step, decomposing said third temporary matrix $\bar{T}_3$ into the product of an orthogonal matrix $\bar{O}$ and an upper triangular matrix $\bar{U}$;

during a sixth step, multiplying the transpose of the updated value of said orthogonal matrix $\bar{O}^T$ from said fifth step by a seventh auxiliary matrix $[\bar{t}_1|\bar{T}_2^T]$, in which seventh auxiliary matrix the first column is said first temporary vector $\bar{t}_1$ from said fourth step and the remaining columns constitute the transpose of said second temporary matrix $\bar{T}_2$ from said third step, to form an eighth auxiliary matrix $[\bar{t}_2|\bar{T}_4]$, in which eighth auxiliary matrix the first column is a second temporary vector $\bar{t}_2$ and the remaining columns constitute a fourth temporary matrix $\bar{T}_4$;

during a seventh step, multiplying the inverse of said upper triangular matrix $\bar{U}^{-1}$ from said fifth step by said eighth auxiliary matrix $[\bar{t}_2|\bar{T}_4]$ from said sixth step, to form a ninth auxiliary matrix, in which ninth auxiliary matrix the first column is a third auxiliary vector $\bar{t}_3$ and the remaining columns constitute a fifth temporary matrix $\bar{T}_5$;

during an eighth step, multiplying said second temporary matrix $\bar{T}_2$ from said third step by a tenth auxiliary matrix $[\bar{t}_3|-\bar{T}_5]$, in which tenth auxiliary matrix the first column is said temporary vector $\bar{t}_3$ and the remaining columns constitute the negative of said fifth temporary matrix from said seventh step, to form a third product, and adding to said third product said third auxiliary matrix $[\bar{x}|\bar{P}]$ from said second step, to form an updated value of said third auxiliary matrix $[\bar{x}|\bar{P}]$ for application to some of said peripheral memory registers; and said plurality of memory registers being configured for coupling said third auxiliary matrix formed in conjunction with said eighth step via at least some of said peripheral registers in at least some of said steps to others of said peripheral registers for use in the first step of said eight-step Kalman-filtering process.

2. The filter of claim 1, wherein the array is simultaneously processing up to 3 separate steps at any instant of time.

3. The filter of claim 1, wherein about $(6M+4N)$ computational steps are necessary for each Kalman-filtering cycle.

4. The filter of claim 1, wherein said connecting means includes a dual-channel coupler between adjacent elements of the network.

5. The filter of claim 4, wherein each processing element is independently connected to each one of the four processing elements respectively above and below and to the right and left thereof, if they are present in the array.

6. The filter of claim 1, wherein said array comprises $N \times (N+1)$ processors, and further comprising:

an additional plurality of processing elements connected in said array to said $N \times (N+1)$ processors of said array, with each of said additional processing elements being configured in a selected one of eight different operational classes; and fault detection means for receiving data from said array for detecting the presence of a fault in a processing element of said array during steps of a cycle.

7. The filter of claim 6, wherein said fault detection means is adapted for causing said filter to perform a replacement cycle for any cycle in which a fault is detected.

8. The filter of claim 7, wherein the replacement cycle restarts at the first step of the Kalman-filtering cycle being used.

9. The filter of claim 6, wherein each of respective zero-th or $(n+1)$-st rows of processors is added respectively before the first row and after the last row of the original array.

10. The filter of claim 9, wherein $(n+2)$-nd and $(n+3)$-rd columns of processors are added after the last column of the original array.

11. The filter of claim 10, wherein the array is extended substantially to a $(N+2) \times (N+3)$ rectangular array.

12. The filter of claim 11, wherein a total of $(4N+6)$ additional processors are connected in the extended network of the array.

13. The filter of claim 10, wherein said fault-detecting means receives array data only from the added $(n+2)$-nd and $(n+3)$-rd columns of processors.

* * * * *